United States Patent
Condrashoff et al.

(10) Patent No.: US 6,841,033 B2
(45) Date of Patent: Jan. 11, 2005

(54) MATERIAL HANDLING SYSTEM AND METHOD FOR A MULTI-WORKPIECE PLASMA TREATMENT SYSTEM

(75) Inventors: Robert S. Condrashoff, Walnut Creek, CA (US); James P. Fazio, Concord, CA (US); David E. Hoffman, Pittsburg, CA (US); James S. Tyler, Galt, CA (US)

(73) Assignee: Nordson Corporation, Westlake, OH (US)

(*) Notice: Subject to any disclaimer, the term of this patent is extended or adjusted under 35 U.S.C. 154(b) by 435 days.

(21) Appl. No.: 09/998,875

(22) Filed: Oct. 31, 2001

(65) Prior Publication Data

US 2002/0134310 A1 Sep. 26, 2002

Related U.S. Application Data

(60) Provisional application No. 60/277,714, filed on Mar. 21, 2001.

(51) Int. Cl.[7] .......................... C23F 1/00; H01L 21/306; C23C 16/00; B65G 49/07
(52) U.S. Cl. .............. 156/345.31; 118/719; 118/723 R; 414/939; 414/806; 414/807
(58) Field of Search ..................... 118/719; 204/298.25; 156/345.31, 345.32; 414/937, 939, 222.09, 222.1, 806; 216/67; 198/346.1, 346.2

(56) References Cited

U.S. PATENT DOCUMENTS

| | | | |
|---|---|---|---|
| 3,294,670 A | 12/1966 | Charschan et al. | 204/298 |
| 3,641,973 A | 2/1972 | Shrader | 118/49 |
| 4,208,159 A | 6/1980 | Uehara et al. | 414/225 |
| 4,252,595 A | 2/1981 | Yamamoto et al. | 156/345 |
| 4,278,528 A | 7/1981 | Kuehnle et al. | 204/298 |
| 4,318,767 A | 3/1982 | Hijikata et al. | 156/345 |
| 4,336,438 A | 6/1982 | Uehara et al. | 219/121 PG |
| 4,405,435 A | 9/1983 | Tateishi et al. | 204/298 |

(List continued on next page.)

FOREIGN PATENT DOCUMENTS

| | | |
|---|---|---|
| DE | 3935002 | 4/1991 |
| JP | 5-164696 | 9/1984 |
| JP | 03-023137 | 1/1991 |
| JP | 03-159143 | 7/1991 |
| JP | 04-123430 | 4/1992 |
| JP | 04-311044 | 11/1992 |
| JP | 6-21032 | 1/1994 |
| JP | 09-129581 | 5/1997 |

OTHER PUBLICATIONS

Panasonic Factory Automation Company, *Plasma Cleaning Systems*, Brochure, Nov. 2000.
Panasonic Factory Automation Company, Japanese Brochure, Nov. 2000.

(List continued on next page.)

*Primary Examiner*—Parviz Hassanzadeh
*Assistant Examiner*—Karla Moore
(74) *Attorney, Agent, or Firm*—Wood, Herron & Evans, L.L.P.

(57) ABSTRACT

A plasma treatment system in which untreated workpieces are serially received one at a time on an infeed table but stored in parallel on the infeed table. The untreated workpieces are transferred simultaneously, in parallel, into a plasma treatment chamber. Thereafter, treated workpieces are transferred simultaneously, in parallel, out of the plasma treatment chamber onto an outfeed table; and the outfeed table serially discharges the treated workpieces one at a time from the outfeed table.

21 Claims, 16 Drawing Sheets

U.S. PATENT DOCUMENTS

| | | | |
|---|---|---|---|
| 4,418,639 A | | 12/1983 | Wills et al. ................... 118/50 |
| 4,483,651 A | * | 11/1984 | Nakane et al. ............... 414/217 |
| 4,550,239 A | | 10/1985 | Uehara et al. ........ 219/121 PG |
| 4,550,242 A | | 10/1985 | Uehara et al. .............. 156/345 |
| 4,575,299 A | | 3/1986 | Layton ........................ 414/222 |
| 4,584,045 A | | 4/1986 | Richards ..................... 156/345 |
| 4,637,853 A | | 1/1987 | Bumble et al. ............. 156/345 |
| 4,705,444 A | | 11/1987 | Tullis et al. ............ 118/729 X |
| 4,770,121 A | | 9/1988 | Ebata et al. ................. 118/686 |
| 4,816,116 A | | 3/1989 | Davis .......................... 156/643 |
| 4,816,638 A | | 3/1989 | Ukai et al. ............. 219/121.43 |
| 4,840,702 A | | 6/1989 | Schumacher, III .......... 156/643 |
| 4,889,609 A | | 12/1989 | Cannella ..................... 204/298 |
| 5,030,056 A | | 7/1991 | Kitayama et al. ........... 414/749 |
| 5,044,871 A | | 9/1991 | Davis et al. ................. 414/786 |
| 5,079,031 A | | 1/1992 | Yamazaki et al. ...... 118/729 X |
| 5,086,729 A | | 2/1992 | Katagiri ...................... 118/729 |
| 5,110,249 A | * | 5/1992 | Norman ....................... 414/217 |
| 5,116,640 A | | 5/1992 | Mikami et al. ......... 118/719 X |
| 5,147,067 A | * | 9/1992 | Effertz ......................... 220/739 |
| 5,216,223 A | | 6/1993 | Straemke ............... 219/121.43 |
| 5,259,942 A | | 11/1993 | Kempf ................... 204/298.25 |
| 5,286,296 A | | 2/1994 | Sato ............................ 118/719 |
| 5,288,684 A | | 2/1994 | Yamazaki ............ 118/723 E X |
| 5,292,393 A | | 3/1994 | Maydan ....................... 156/345 |
| 5,302,077 A | | 4/1994 | Sato ............................ 414/609 |
| 5,303,671 A | | 4/1994 | Kondo ........................ 118/719 |
| 5,310,410 A | | 5/1994 | Begin ........................ 29/25.01 |
| 5,314,298 A | | 5/1994 | Kim ........................ 414/797.9 |
| 5,345,056 A | | 9/1994 | Frei et al. ............... 219/121.59 |
| 5,387,265 A | | 2/1995 | Kakizaki et al. ........ 118/730 X |
| 5,433,371 A | | 7/1995 | Morisako ................. 228/180.5 |
| 5,480,052 A | | 1/1996 | Furr et al. ..................... 216/71 |
| 5,492,265 A | | 2/1996 | Wandke ...................... 228/205 |
| 5,515,986 A | | 5/1996 | Turlot et al. ............ 156/345 X |
| 5,518,599 A | * | 5/1996 | Schwartz et al. ...... 204/298.25 |
| 5,542,559 A | | 8/1996 | Kawakami et al. ........... 216/67 |
| 5,573,597 A | | 11/1996 | Lantsman ............ 118/723 MP |
| 5,576,629 A | | 11/1996 | Turner et al. ................ 324/709 |
| 5,587,205 A | | 12/1996 | Saito et al. .................. 427/553 |
| 5,609,290 A | | 3/1997 | Bobbio et al. ............... 228/206 |
| 5,634,765 A | | 6/1997 | Miyoshi ...................... 414/786 |
| 5,647,942 A | | 7/1997 | Haji ............................ 156/281 |
| 5,707,485 A | | 1/1998 | Rolfson et al. .......... 156/643.1 |
| 5,767,008 A | | 6/1998 | Haji ............................ 438/612 |
| 5,779,807 A | | 7/1998 | Dornfest et al. .............. 134/1.2 |
| 5,823,416 A | | 10/1998 | Haji |
| 5,958,510 A | | 9/1999 | Sivaramakrishnam et al. ....................... 427/255.6 |
| 5,972,163 A | | 10/1999 | Haji ............................ 156/345 |
| 6,093,904 A | | 7/2000 | Haji |
| 6,217,272 B1 | * | 4/2001 | Felsenthal et al. ........... 414/217 |
| 6,331,347 B2 | | 12/2001 | Haji ............................ 428/209 |
| 6,609,877 B1 | * | 8/2003 | Ramsay ...................... 118/719 |
| 6,682,288 B2 | * | 1/2004 | Klein et al. .................. 414/217 |

OTHER PUBLICATIONS

March Instruments, Inc., *In–Line Plasma System*, Brochure, Aug. 1995.

March Instruments, Inc., *TAC Technology Advancement Center*, Brochure, Feb. 1995.

Materials Research Corporation, *1.12 Inline production magnetron sputtering*, Journal Article, 3 pages.

Von Dr.–Ing M. Nowottnic, Fraunhofer–Einrichtung fur Zuverlassigkeit und Mikrointegration (IZM), Berlin, *Plasmabehandlung als umweltfreundliche Alternative in der Leiterplattenfertigung*, Galvanotechnik D–88348 Saulgau 86 (1995) Nr. 4; Journal Article, 6 pages.

* cited by examiner

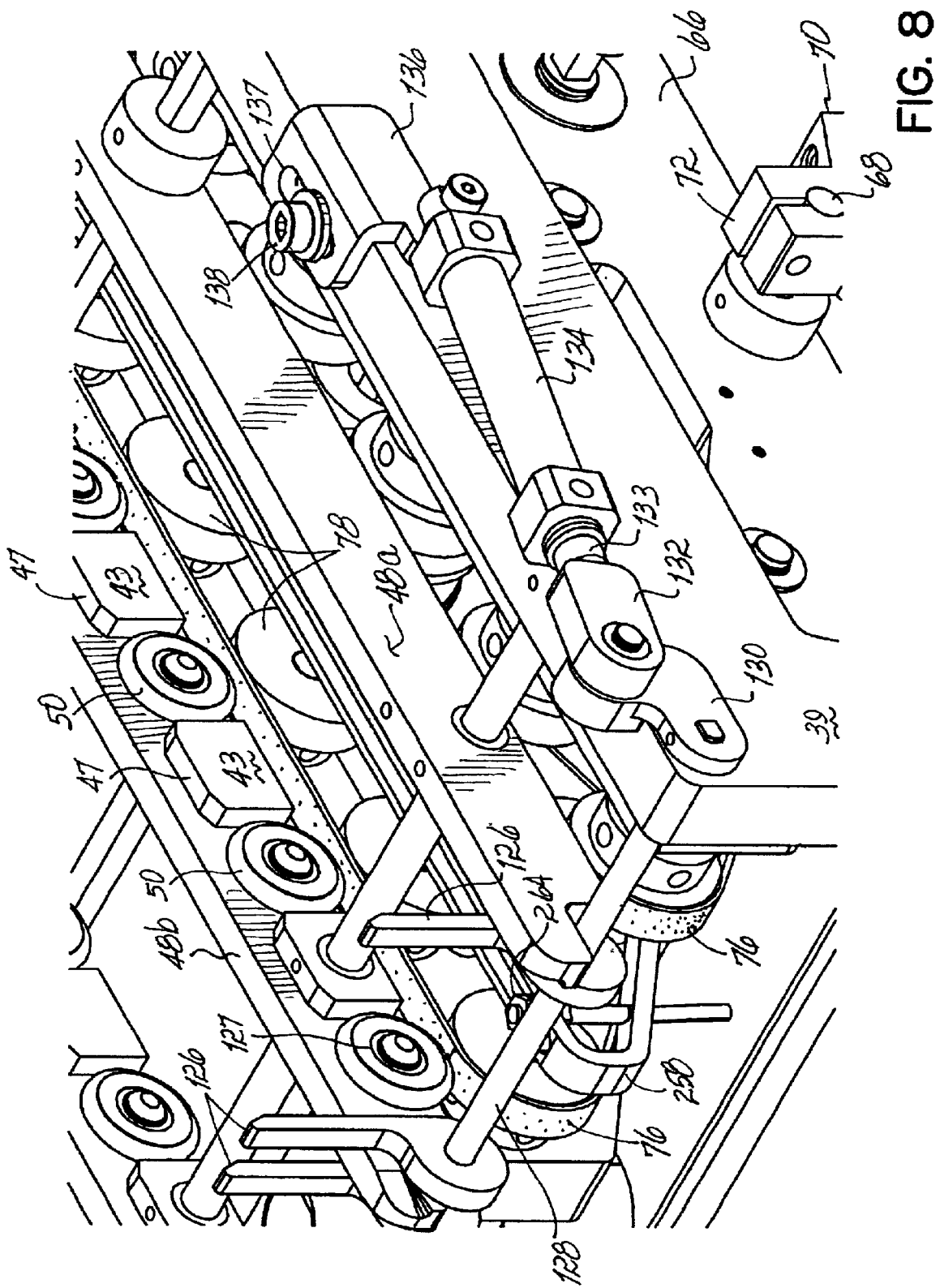

MATERIAL HANDLING SYSTEM AND METHOD FOR A MULTI-WORKPIECE PLASMA TREATMENT SYSTEM

This application claims the benefit of provisional application Ser. No. 60/277,714 filed Mar. 21, 2001.

FIELD OF THE INVENTION

This invention relates to plasma treatment systems and more particularly, to methods and apparatus relating to a multi-workpiece plasma treatment system.

BACKGROUND OF THE INVENTION

The manufacture and packaging of electronic components or workpieces such as semiconductors and flat panel displays often takes place within a series of individual processing stations that are designed to perform a specific type of processing operation such as a deposition, an etching, a thermal processing, or a cleaning. Processing systems have been designed in which multiple processing stations are arranged sequentially to form an in-line tool or are positioned in a cluster to form a cluster tool. Plasma treatment chambers are incorporated into processing stations for exposing workpieces to a plasma in preparation for another operation in a successive processing station. A plasma treatment process is used to etch, clean or otherwise process or treat a surface of the workpiece. Workpieces are often transferred to and from the plasma treatment chamber via a conveyor, robot or manually; and other workpiece handling devices are used to shuttle the workpieces into and out of a plasma treatment chamber.

While such plasma treatment systems have worked reasonably well in the past, the structure of such systems imposes certain limitations on their operation that limit system efficiency and throughput. For example, most processing systems are in-line serial processing systems that utilize in-line parts conveyors. Therefore, one treatment chamber normally treats only one individually-handled workpiece at a time. In some applications, it is possible to simultaneously process two individually-handled workpieces in the plasma chamber; however, it is believed that two is the maximum number of individually-handled workpieces that have been simultaneously processed in known plasma treatment chambers.

Another limitation in the structure of conventional plasma treatment systems relates to the workpiece handling systems that are currently available. Known workpiece handling systems are relatively bulky and large and make the handling of workpieces, either individually or in bulk, within a small volume extremely difficult.

Another disadvantage of known plasma treatment systems is that a plasma treatment machine has a fixed footprint that consumes a fixed amount of manufacturing floor space. Thus, every time another plasma treatment machine is added to increase throughput, additional manufacturing floor space is required in direct proportion to the number of plasma machines added. The cost of additional floor space is substantial and may require the construction of an additional structure or building. Another disadvantage arising from processing a single workpiece at a time in a plasma treatment chamber is a less efficient use of electric and gas utilities.

Therefore, there is a need to substantially improve processing efficiency of the plasma treatment system. There is a further need to improve the throughput of each plasma treatment machine footprint. There is a still further need to provide material handling devices that are more compact and have the ability to handle workpieces, both in bulk and individually, more quickly and efficiently.

SUMMARY OF THE INVENTION

The plasma treatment system of the present invention has the ability to simultaneously handle and plasma treat a plurality of workpieces. Thus, plasma treatment system of the present invention has a substantially increased throughput, thereby providing a substantial advantage of reducing the per unit cost of the workpieces being processed.

The plasma treatment system of the present invention further has a compact footprint, thereby providing a further advantage of substantially increasing the throughput capability of the utilized floor space. Thus, the plasma treatment system of the present invention is especially useful where increased capacity is desired and manufacturing floor space is limited or otherwise at a premium.

The ability to handle and simultaneously process a plurality of workpieces provides a user with a still further advantage of operating the plasma treatment system in a manner deemed most efficient and economical by the user.

The present invention also provides improved material handling devices for handling the workpieces both individually and in bulk. Such material handling devices substantially reduce the cycle time of loading and unloading workpieces from the plasma treatment chambers, thereby further improving throughput and providing further additional cost benefits. Thus, the plasma treatment system of the present invention provides a more compact, reliable, efficient and cost effective plasma treatment process than was previously available.

According to the principles of the present invention and in accordance with the preferred embodiments, the invention provides a plasma treatment system having a plasma treatment chamber for treating workpieces. An infeed table is disposed at one end of the plasma treatment chamber, and the infeed table serially receives workpieces one at a time and stores the workpieces in parallel. An outfeed table is disposed at an opposite end of the plasma treatment chamber. The outfeed table stores the workpieces in parallel and serially discharges the workpieces one at a time from the outfeed table. A transfer system has load and unload pusher arms mounted on a common carriage. The load pusher arm is located at the infeed table and transfers simultaneously all of the workpieces stored on the infeed table into the plasma treatment chamber. The unload pusher arm is located at the plasma treatment chamber and moves simultaneously with the load pusher arm to transfer simultaneously all of the workpieces in the plasma treatment chamber onto the outfeed table.

In one aspect of the invention, the plasma treatment system of the present invention can load, unload and plasma treat up to 7 workpieces in parallel.

In another embodiment of the invention, a method is provided for serially receiving workpieces on an infeed table and transferring the workpieces simultaneously in parallel into a plasma treatment chamber. Thereafter, the workpieces are transferred in parallel out of the plasma treatment chamber onto an outfeed table, and the workpieces are discharged serially one at a time from the outfeed table.

These and other objects and advantages of the present invention will become more readily apparent during the following detailed description taken in conjunction with the drawings herein.

BRIEF DESCRIPTION OF THE DRAWINGS

FIG. 6A is an exploded view of a portion of the end view of the infeed table of FIG. 6.

FIG. 8 is a partial perspective view of bridges located on a discharge end of the infeed table of FIG. 2.

DETAILED DESCRIPTION OF THE INVENTION

Figure 1:
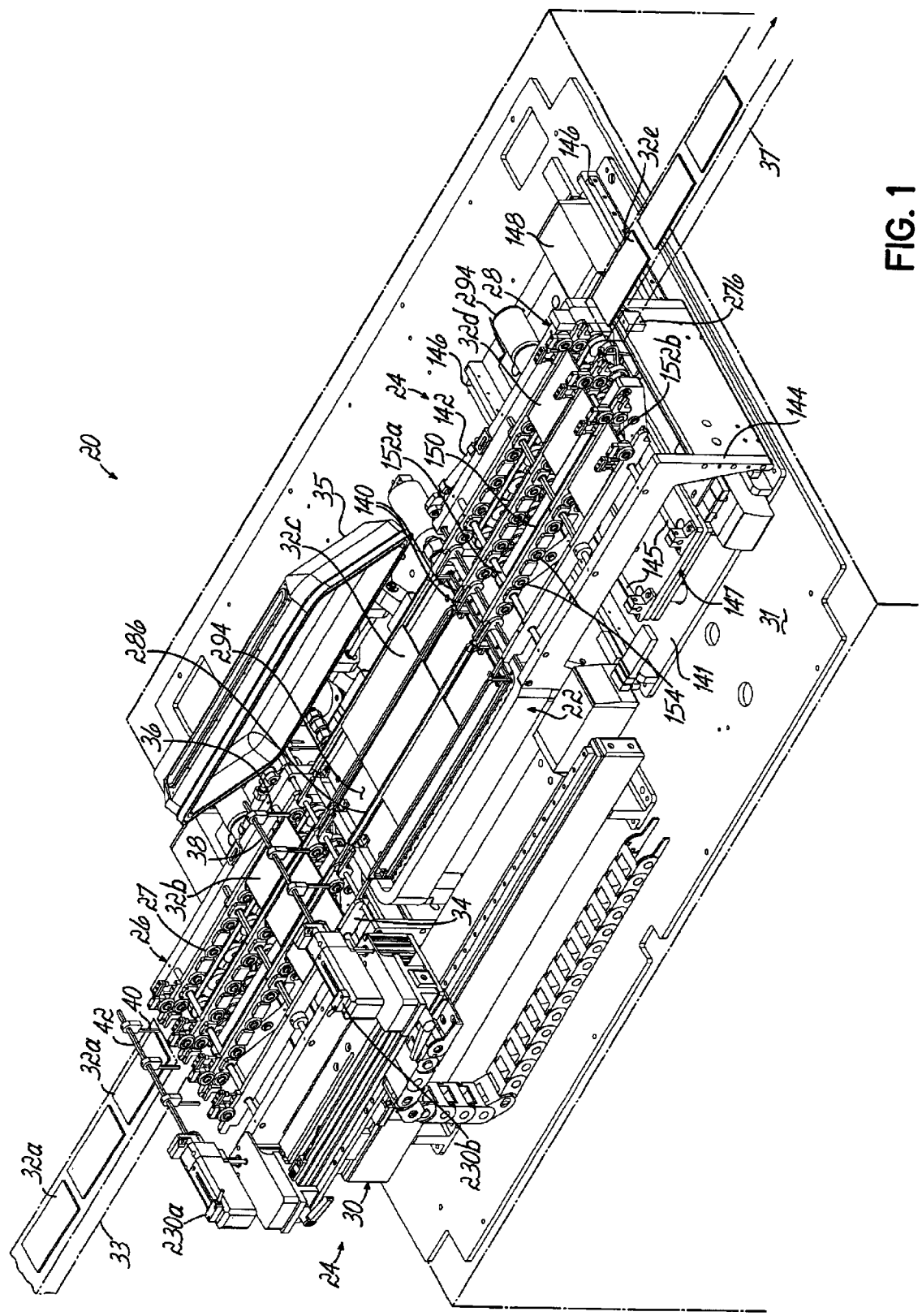
FIG. 1 is a perspective view of a plasma treatment system in accordance with the principles of the present invention.

Referring to FIG. 1, a processing station comprises a plasma treatment system 20 that includes a high speed plasma treatment chamber 22 and material handling system indicated generally at 24. The material handling system 24 generally comprises an infeed table 26, an outfeed table 28 and a transfer system 30 which are modular systems that are movable from a top plate 31. The plasma treatment system 20 is mounted on a top plate 31 that is normally part of a cabinet or housing (not shown). Workpieces 32 may be substrates for packaging semiconductor devices, such as ball grid arrays, flip chip packaging, lead frames, wired bonded packages, or other boards. However, the present invention need not be limited strictly to semiconductor packaging substrates and can be readily adapted to processing other substrates including semiconductor wafers and flat panel displays. In addition, the present invention can accommodate workpieces such as boats or cassettes holding a plurality of devices or packages.

The plasma treatment system 20 is normally part of an in-line processing system in which untreated or preprocessed workpieces 32a are provided to the plasma treatment system 20 one at a time in a serial fashion by an upstream material handler 33 shown in phantom in FIG. 1. The infeed table 26 has a table transfer system 27 that is configurable to handle several of the workpieces 32. For example, the infeed table may be configured to receive and store anywhere from one to seven preprocessed workpieces 32. Although received one at a time, the preprocessed workpieces 32b are arranged and stored in parallel across the infeed table 26 such that the forward edges of the preprocessed workpieces are aligned at an inner end 34. Thus, the infeed table 26 functions as a parallel buffer or queue for the preprocessed workpieces 32b prior to their being processed in parallel in the plasma treatment chamber 22.

When the processing of workpieces 32c in the chamber 22 is completed, the lid 35 pivots to its illustrated raised position. The transfer system 30 utilizes a set of unload pushers 36 on an unload pusher bar 38 and a set of load pushers 40 on a load pusher bar 42. The transfer system 30 moves the unload and load pusher arms 38, 42 simultaneously. Therefore, the unload pushers 36 push the treated or postprocessed workpieces 32c out of the plasma treatment chamber 22 onto the outfeed table 28. On the outfeed table 28, postprocessed workpieces 32d are buffered or queued in parallel. Simultaneously, the load pushers 40 are pushing the preprocessed workpieces 32b from the infeed table 26 into the plasma treatment chamber 22. Thereafter, the transfer system 30 returns the pusher bars 36, 40 to their illustrated home position. The infeed table 26 then operates with the upstream material handler 33 to again serially accept the incoming preprocessed workpieces 32a and buffer those workpieces in a parallel fashion on the infeed table 26. Simultaneously, the outfeed table 28 is aligned with a downstream workpiece handler 37 (shown in phantom); and the outfeed table 28 serially transfers the buffered postprocessed workpieces 32d one at a time to the downstream workpiece handler 37. Thus, the outfeed table 28 receives the workpieces 32d in parallel and unloads the workpieces 32d one at a time in a serial manner. The downstream workpiece handler then continues a serial in-line transfer of the postprocessed workpieces 32e.

As will be appreciated, a significant feature of the infeed and outfeed tables 26, 28 is to manipulate respective preprocessed and postprocessed workpieces both serially and in parallel while a plurality of other workpieces are being processed in parallel in the plasma treatment chamber 22. That feature provides a substantial improvement in efficiency and throughput when compared to known systems, which normally process workpieces in a serial manner.

The plasma treatment chamber 22 energizes atoms of a processed gas at a sub-atmospheric pressure to generate a plasma, which is used to modify or treat the surface properties of the workpieces 32. The plasma treatment chamber 22 operates to treat the workpieces 32 according to user determined plasma treatment schedules or recipes. The plasma treatment chamber 22 is controlled by a programmable control and therefore, can process diverse types of workpieces in accordance with different recipes. By way of specific example but not a limitation, the plasma treatment chamber for use with the present invention is disclosed in P.C.T. application Serial No. U.S. 00/10897 in the name of James Tyler entitled "High-Speed Symmetrical Plasma Etching Device", filed on Jul. 10, 2000 which application is hereby incorporated by reference herein in its entirety. The lid 35 of the plasma treatment chamber 22 is pivotally opened and closed by a pneumatically actuated hinge assembly in a known manner. A bleed valve is used to vent the interior of the chamber 22 to atmospheric pressure and a pressure gauge is used to monitor pressure within the chamber 22 in a known manner. The plasma treatment chamber 22 has associated known internal and external structures (not shown) such as a radio frequency generator and a vacuum pump that are used to initiate and sustain the plasma within the chamber 22 from a subatmospheric pressure of a process gas.

Figure 2:
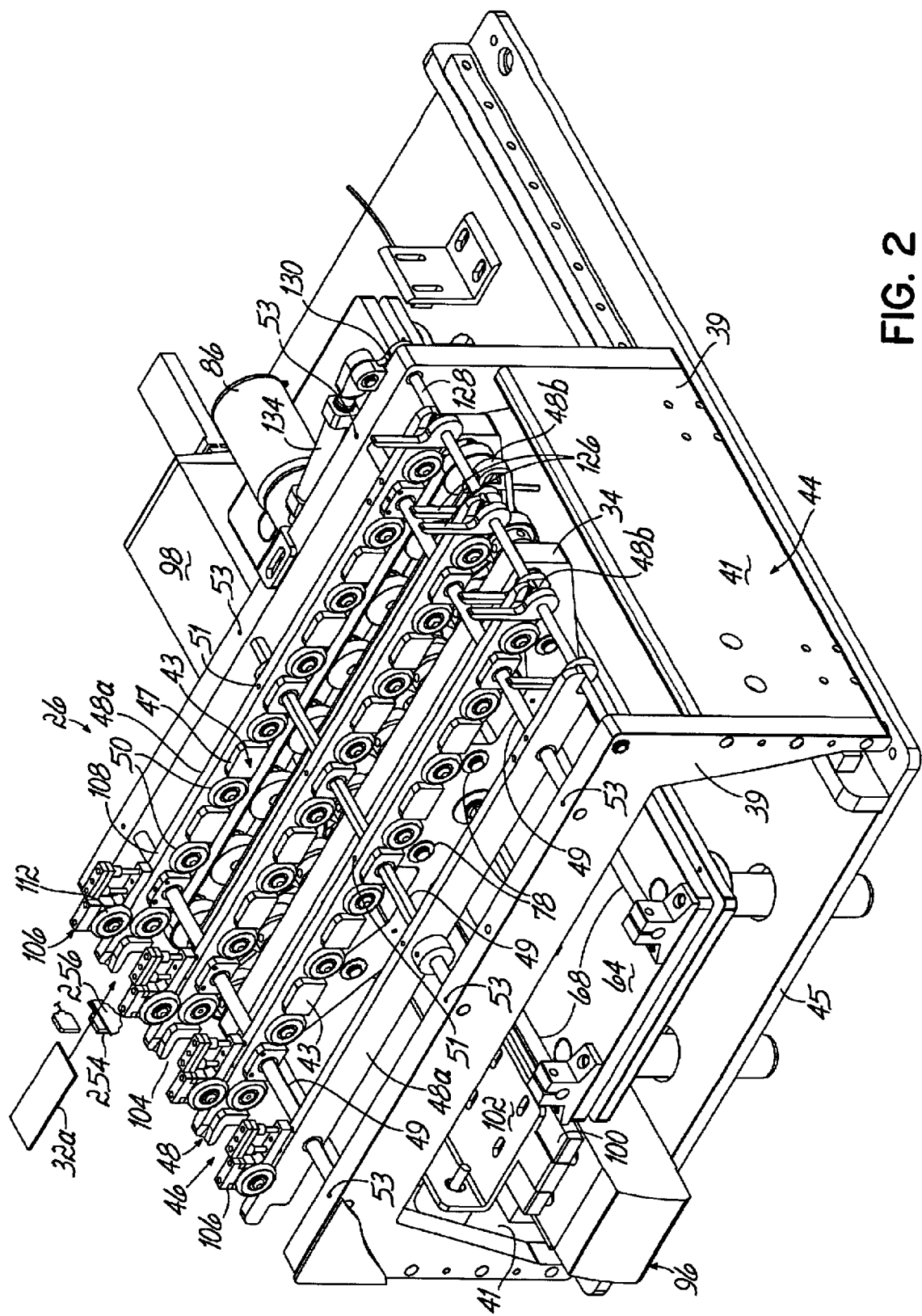
FIG. 2 is a perspective view of an infeed table for the plasma treatment system of FIG. 1.
Figure 3:
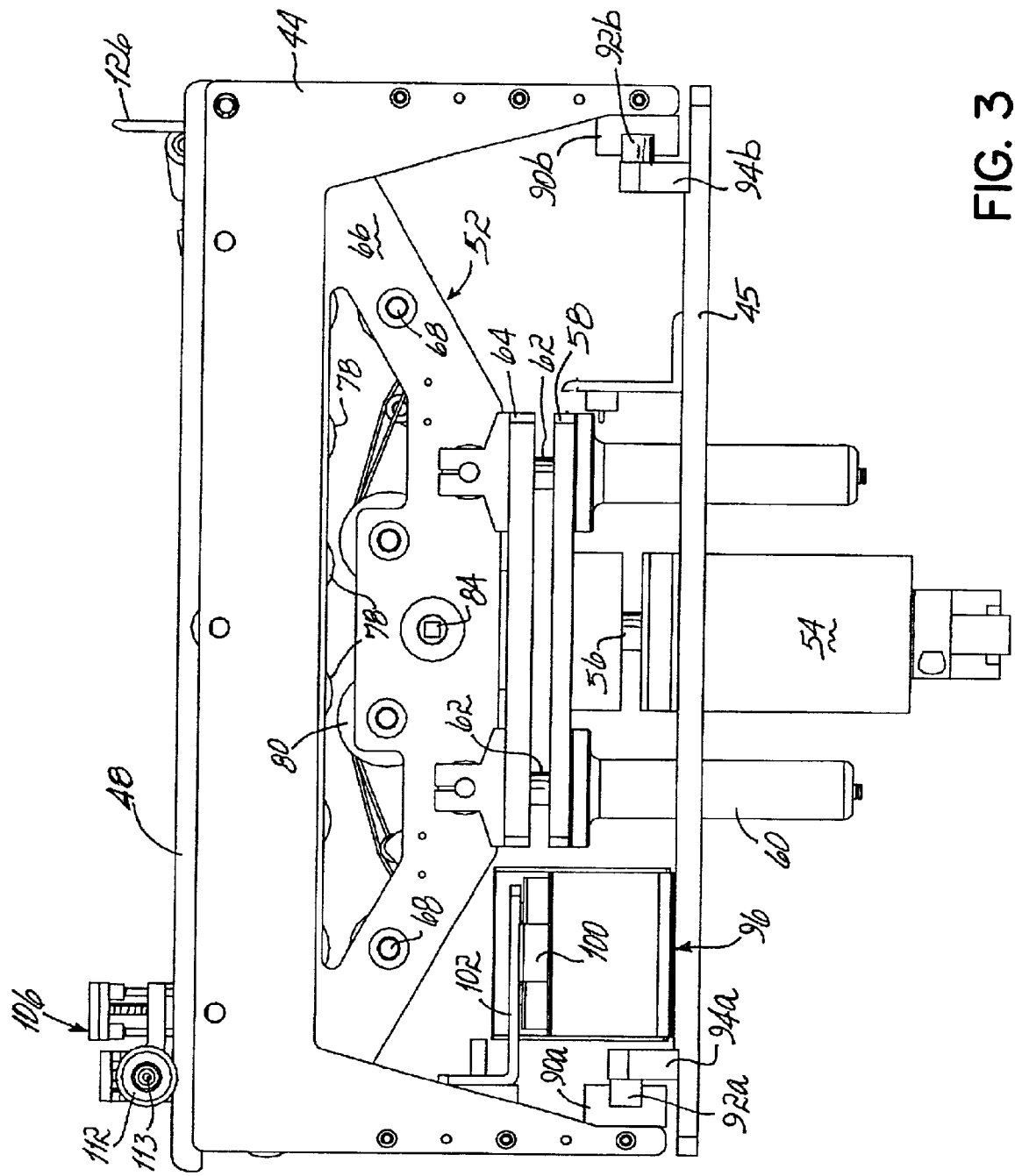
FIG. 3 is a side view of the infeed table of FIG. 2.

Referring to FIG. 2, the infeed table 26 is comprised of a table 44 that is mounted for linear motion on the base plate 45. The table 44 has sides 39 forming legs, and ends 41 separate the table sides 39 by a desired distance. The infeed table 26 is installable as an assembly by fastening the base plate 45 to a top plate 31 (FIG. 1). The table transfer system 27 has a rail assembly 46 comprised of a plurality of rails 48 supported on the table 44. Each pair of rails provides a track for a workpiece and function to guide and support the loading of the workpieces 32 onto the table 44. The table transfer system 27 further has support blocks 43 and rollers 50. Outer rails 48*a* have support blocks 43 and rollers 50 on only one side, whereas inner rails 48*b* have support blocks 43 and rollers 50 on both sides. The support blocks 43 and drive rollers 50 are arranged in an alternating pattern along a length of a rail. The support blocks 43 have respective generally horizontal, upper surfaces 47 that are positioned with respect to the drive rollers 50 so that the surfaces 47 do not impede the transfer of the workpieces by the drive rollers 50. Thus, the surfaces 47 are normally located slightly below a horizontal tangential line extending across the tops of the drive rollers 50. The surfaces 47 are designed to provide intermediate lateral edge support on a bottom surface of a workpiece as required. For example, stiffer workpieces transported by the drive rollers 50 may not contact the surfaces 47, whereas less stiff workpieces transported by the drive rollers 47 may contact the surfaces 47. The drive rollers 50 also contact the bottom surface of a workpiece 32 adjacent its lateral edges. The rollers 50 are simultaneously driven to guide and move the workpieces 32 between the rails 48 on the table 44.

The rails 48 are slidably mounted on support bars 49 and secured at a desired location on the support bars 49 by locking screws 51. The support bars 49 are secured to opposite sides 39 of the table 44 by locking screws 53. Thus, by loosening appropriate locking screws 53, an end of the support bars may be removed from one side of the table, thereby permitting rails 48 to be slid on or off the support bars 49. With the current design, the table 44 is designed to accommodate up to 8 rails 48, thereby permitting up to 7 workpieces to be loaded on the infeed table 26 at one time.

Figure 4:
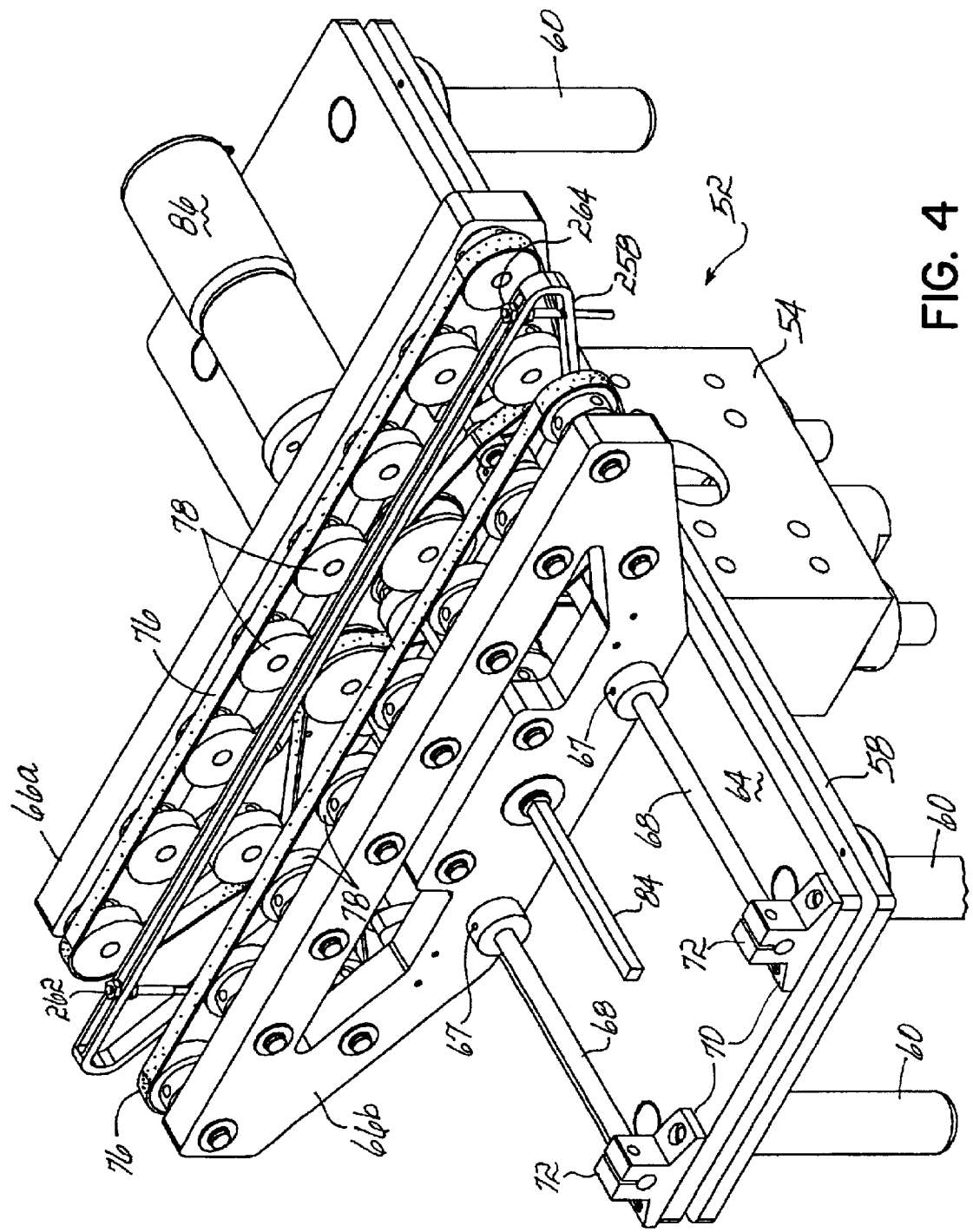
FIG. 4 is a perspective view of a belt drive assembly used in the infeed table of FIG. 2.

Referring to FIGS. 3–6, the table transfer system 27 further includes a belt drive assembly 52 that powers the drive rollers 50. The belt drive assembly 52 has a cylinder 54 that is mechanically connected to the base plate 45 with jackscrews (not shown). Thus, the cylinder 54 is adjustable with respect to the base plate 45 in the generally vertical direction. The cylinder 54 is normally a fluid operated cylinder that is powered by pressurized air supplied by a pneumatic source 57 (FIG. 12) via a solenoid valve 59 that may be for example, a 4-way solenoid valve. The cylinder 54 has a movable cylinder rod portion 56 connected to an upper support plate 58, and guide rods (not shown) guide the cylinder rod 56 in a known manner. Four spring tube bodies 60 are rigidly mounted near the corners of the upper support plate 58. The resiliently suspended shafts 62 within the spring tube bodies 60 are connected to the corners of a floating plate 64. Referring to FIG. 4 illustrating only the belt drive assembly, bearing housings 66 are adjustably mounted on support rails 68. The support rails 68 are secured at their ends by clamps 72 on mounting blocks 70 attached to the floating plate 64. The bearing housing 66*b* is locked in position on the support rails 68 by setscrews 67. By loosening the setscrews 67, the bearing housing 66*b* is slidable over the support rails 68 to accommodate any width of workpiece that is within the range of a width specification.

Figure 5:
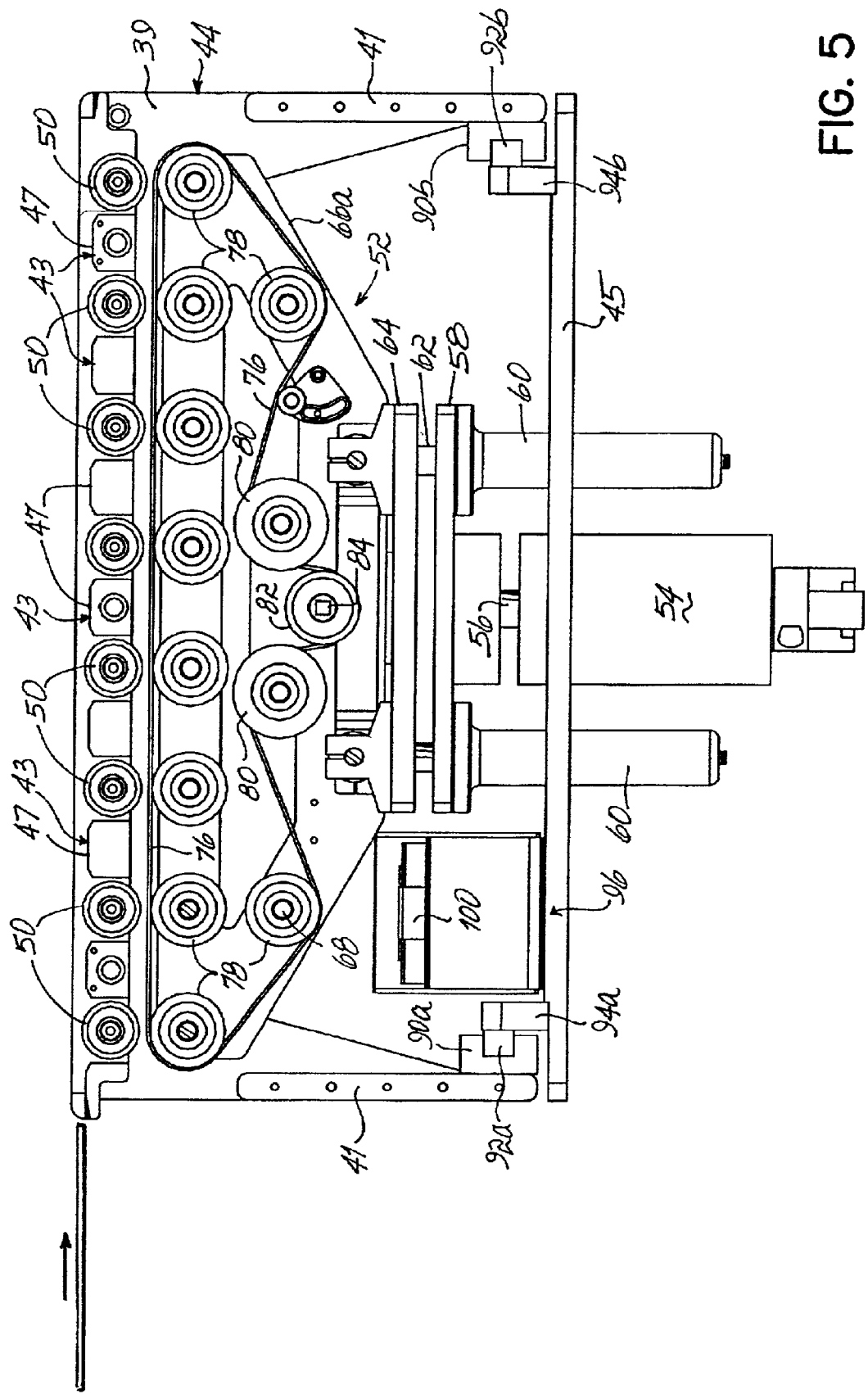
FIG. 5 is a partial end view of the belt drive assembly of FIG. 4 with the bearing housing removed.

Each bearing housing 66 has belt rollers 78 that support a belt 76 along a linear path across the top of each bearing housing 66. As shown in FIG. 5, the belt 76 also passes over idler pulleys 80 and drive pulley 82. The drive pulley 82 is slidably mounted on a drive shaft 84 that is connected to the output shaft of a belt drive motor 86 (FIG. 4). It should be noted that the drive shaft 84 has a noncircular cross-sectional profile so that the bearing housing 66*b* and associated drive pulley 84 can be slidably repositioned along the drive shaft 84 while maintaining the drive shaft 84 in driving engagement with the drive pulley 82.

As shown in FIG. 5, the cylinder rod 56 is retracted and the belt drive assembly 52 is in its lower position in which the belt 76 is out of contact with the drive rollers 50. When it is desired to power the drive rollers 50, the cylinder 54 is operated to extend the cylinder rod 56 and raise the floating plate 64 such that the drive belt 76 contacts the drive rollers 50. Thus, the moving belt 76 rotates the drive rollers 50 that, in turn, contact the underside of a workpiece 32 adjacent its lateral edge, thereby linearly moving the workpiece over the table 44 between the rails 48. The floating or suspended moving belt 76 is effective to apply a substantially equal force against the drive rollers 50. After a workpiece is loaded onto the table 44, the belt drive motor 86 is turned off; and the state of the cylinder 54 is toggled to lower the belt 76 out of contact with the drive rollers 50 as shown in FIG. 5.

Referring to FIG. 2, after a workpiece 32*b* has been loaded between a first pair of rails 48, the table 44 can be indexed to align the next pair of rails 48 with the incoming workpieces 32*a*, so that a second workpiece 32*b* can be loaded onto the table 44 in parallel with an adjacent to the first workpiece. The table transfer system 27 includes a rail transfer system that provides a table indexing motion by mounting the table 44 to a pair of linear bearings 90*a*, 90*b* (FIG. 3) on opposite sides of the table 44. Each of the linear bearings 90*a*, 90*b* is slidably mounted on respective linear rails 92*a*, 92*b*. The linear rails 92*a*, 92*b* are rigidly connected to respective mounting bars 94*a*, 94*b* that, in turn, are rigidly secured to the base plate 45. The rail transfer system includes a servodrive assembly 96 has a motor 98 (FIG. 2) rigidly connected to a drive screw (not shown) in a known manner. A carriage 100 is rotatably mounted to the drive screw and moves longitudinally therealong in response to the motor 98 rotating the drive screw. A generally L-shaped bracket 102 has one leg rigidly connected to the carriage 100 and another leg connected to one end 41 of the table 44. Thus, the servodrive 96 is operative to move the table 44 and rails 48 in a direction generally perpendicular to the direction of motion of the workpieces 32.

Figure 6:
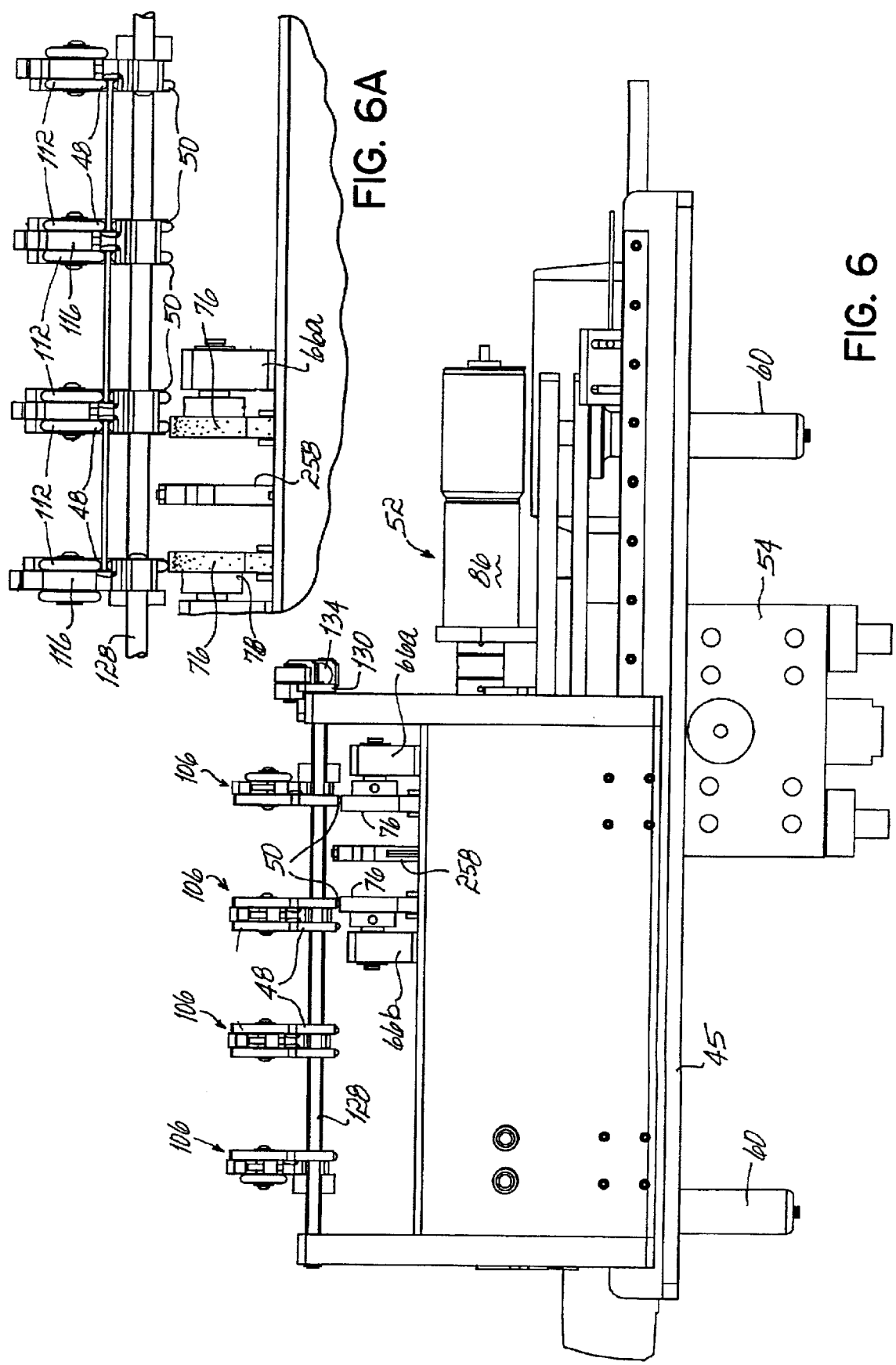
FIG. 6 is an end view of the infeed table of FIG. 2.
Figure 7:
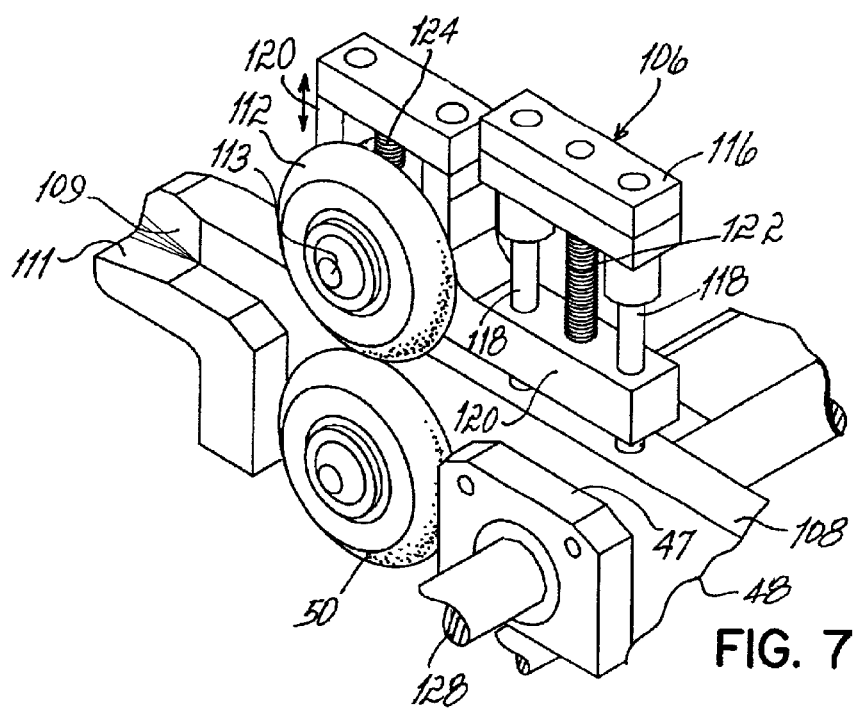
FIG. 7 is a perspective view of a pinch wheel assembly located on an input end of the infeed table of FIG. 2.

Referring to FIG. 2, the outer or input end 104 of each rail 48 has a pinch wheel assembly 106 that is shown in further detail in FIG. 7. Each rail 48 has a center portion 108 on which the pinch wheel assembly 106 is mounted. Further, each rail 48 has an entry portion with a generally vertical surface 109 that flares outward at its end and a generally horizontal surface 111 the flares downward at its end. The flared surfaces 109, 111 at the entry end of the rail 48 capture and guide a workpiece being loaded onto a desired path. The pinch wheel assembly 106 has resiliently mounted pinch wheels 112 mounted on a common axle 113, so that a pinch wheel 112 is disposed on each side of the rail 48 (FIG. 6A) immediately above a drive roller 50. As the workpiece is received between a pair of rails 48, the upstream workpiece handler pushes it between pinch wheels 112 and drive rollers 50 below the pinch wheels 112. The pinch wheels 112 apply a pinching force against an upper surface of the workpiece as it is moved between the pinch wheels 112 and respective drive rollers 50.

The pinch wheel assembly 106 has a mounting block 116 with vertically extending posts 118 that are rigidly disposed within the upper portion 108 of the rail 48. The pinch wheel axle 113 is mounted to a carriage 120 that, in turn, is slidably mounted on the vertical posts 118. An adjusting screw 122 is rotatably mounted within the block 116 and threadedly engages the carriage 120. Thus, by rotating the adjusting screw 122, the carriage 120 and the pinch wheels 112 may be adjusted in the vertical direction. Hence, the pinch wheels 112 can be adjusted to accommodate different thicknesses of the workpieces 32. Further, the adjusting screw 122 permits the height of the pinch wheels 112 to be adjusted so that the biasing spring 124 applies the desired pinch force to the workpieces 32.

Referring to FIGS. 2 and 8, the inner or discharge end 34 of the table 44 has bridges 126 associated with each track between two adjacent rails 48. A bridge 126 is disposed on each side of a rail 48 adjacent the last roller 127. The bridges 126 are rigidly connected to a drive shaft 128. The end of the drive shaft 128 is rigidly connected to one end of a generally L-shaped pivot link or cam 130. The other end of the pivot link 130 is rotatably connected to a clevis 132 attached to the distal end of a cylinder rod 133 of a bridge cylinder 134. The bridge cylinder 134 is normally a fluid operated cylinder that is powered by pressurized air supplied by a pneumatic source 57 (FIG. 12) via a solenoid valve 135 that may be for example, a 4-way solenoid valve. With the cylinder rod 132 retracted in the cylinder 134 as shown in FIG. 8, the bridges 126 are oriented in a generally vertical or up position and function as positive stops for workpieces as they are translated by the drive rollers 50 over the surfaces 47 between the rails 48. Actuating the cylinder 134 extends the cylinder rod 132 and pivots the bridges 126 approximately 90° to a generally horizontal or down position, as shown in FIG. 1. In the down position, bridges 126 provide surfaces for supporting the workpieces as they are pushed by the unload pushers 42 across the gap between the infeed table 26 and the plasma treatment chamber 22. The cylinder 134 is mounted to the table side 39 by a mounting bracket 136. By loosening the fastener 138 extending through the slot 137, the location of bracket 136 and cylinder 134 can be changed, so that the down position of the bridges 126 can be precisely adjusted.

In FIG. 1, it should be noted that the outfeed table 28 is substantially a mirror image of the infeed table 26. The outfeed table 28 is a modular assembly having a base plate 141 that is mounted to the top plate 31 by fasteners or other means. The outfeed table 28 has bridges 140 that are raised and lowered using a bridge cylinder 142 in a manner identical to that described with respect to the bridges 126 of FIG. 8. The bridge cylinder 142 is normally a fluid operated cylinder that is powered by pressurized air supplied by a pneumatic source 57 (FIG. 12) via a solenoid valve 143 that may be for example, a 4-way solenoid valve. Further, the outfeed table 28 includes a linearly moving table 144 that is movable along rails 146 by a servodrive 148. The table 144 and servodrive 148 operate in a manner substantially similar to the table 44 and servodrive 96 earlier described. The table 144 further has a plurality of rails 150 that are slidably mounted on cross members 152 and rotatably support drive rollers 154. The drive rollers are drivingly engaged a belt (not shown) that is mounted on a belt drive assembly 147.

The belt drive assembly 147 is raised and lowered by a belt cylinder 151 (FIG. 12) and is similar in construction and operation to the belt drive assembly 52 on the infeed table 26. The belt cylinder 151 is normally a fluid operated cylinder that is powered by pressurized air from a pneumatic source 57 via a solenoid valve 153 that may be for example, a 4-way solenoid valve. The rails 150 and drive rollers 154 are constructed and function similar to the rails 48 and drive rollers 50 on the infeed table 26.

Figure 9:
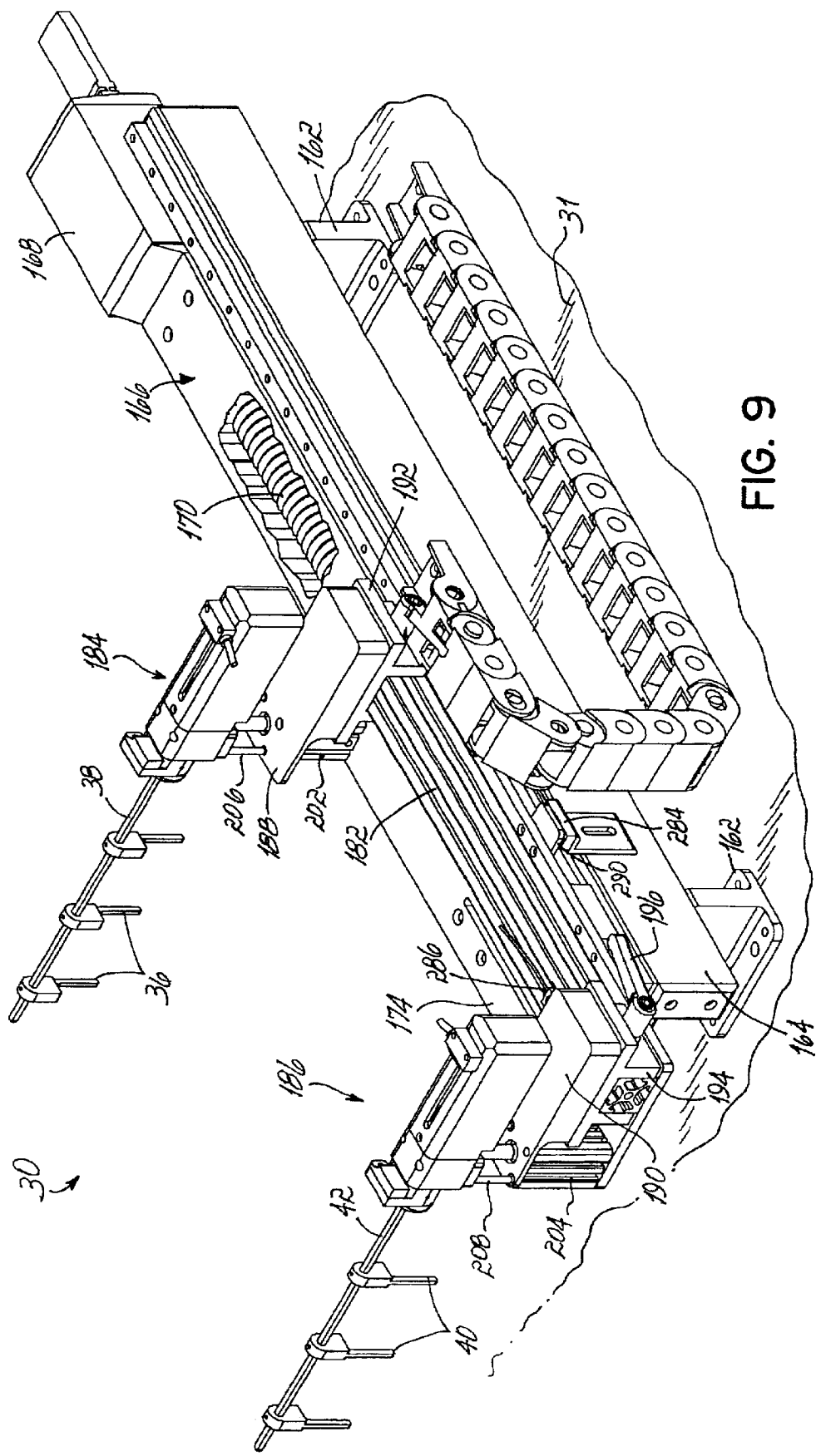
FIG. 9 is a perspective view of a transfer system for the plasma treatment system of FIG. 1.
Figure 10:
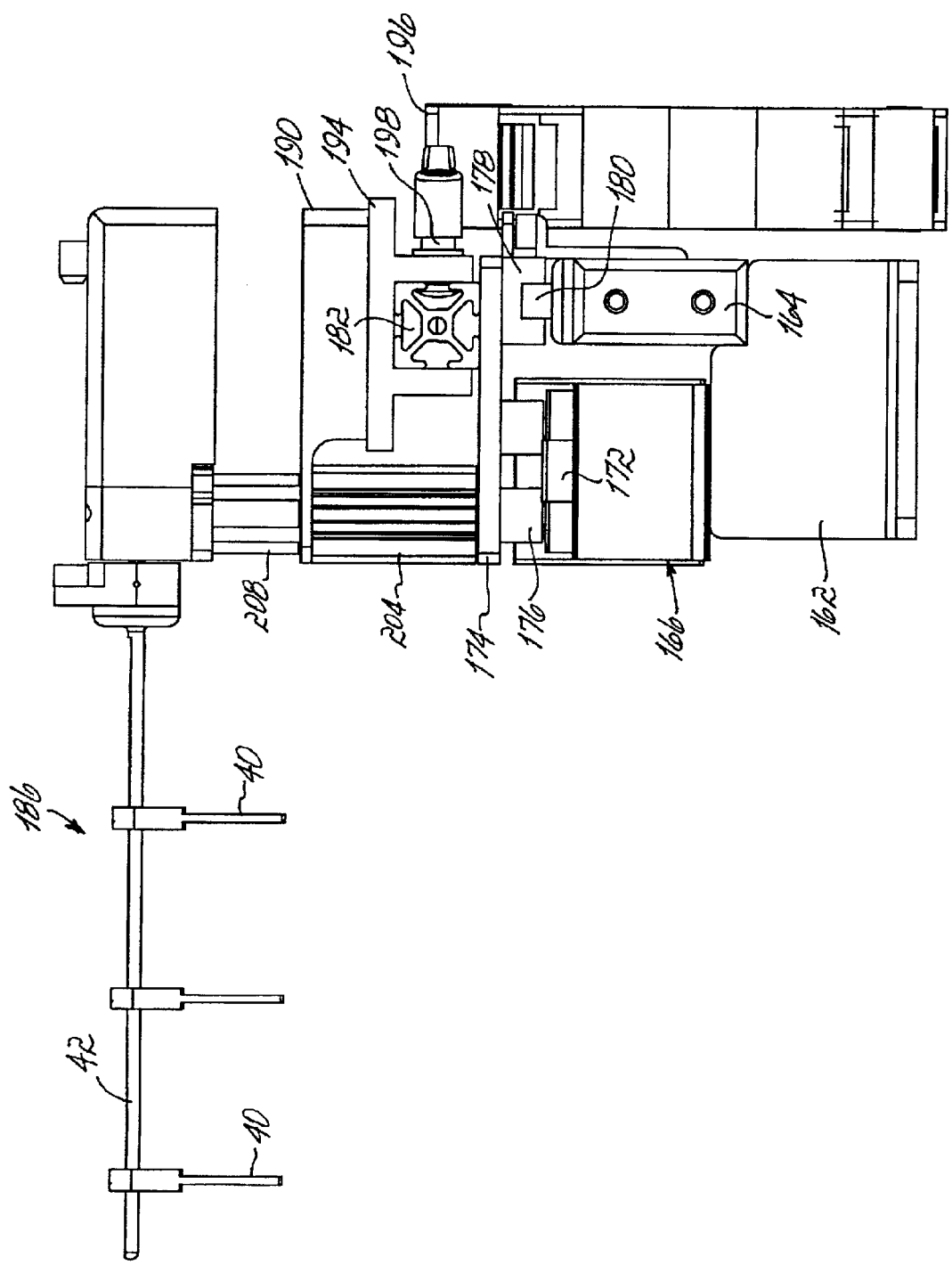
FIG. 10 is an end view of the transfer system of FIG. 9.

Referring to FIG. 9, the transfer system 30 is supported by a pair of stands 162 rigidly connected to the top plate 31 of the plasma treatment system 20. A support beam 164 is mounted on top of the stands 162 and extends the length of the transfer system 30. A servodrive unit 166 also extends across the top of the stands 162 over the length of the transfer system 30. The servodrive unit has a servomotor 168 that rotates a drive screw 170. Referring to FIG. 10, a carriage 172 is rotatably mounted to the drive screw 170 and moves longitudinally with respect to the drive screw 170 in response to the operation of the servomotor 168. A mounting plate 174 is resiliently supported on one side by rubber grommets 176 that are also affixed to the carriage 172. The mounting plate is rigidly connected on an opposite side to a linear bearing 178 that rides on a linear rail 180 supported by the beam 164. Thus, operation of the servomotor 168 is effective to move the mounting plate 174 longitudinally along the drive screw 170.

The unload and load pusher arms 38, 42, respectively, are supported on the mounting plate 174 and move therewith. The adjustment mechanism is facilitated by bearing rail 182 that is fastened into the top of the mounting plate 174. The bearing rail is normally an extruded aluminum member having a substantially square cross section. The pusher arms 38, 42 are part of respective pusher arm assemblies 184, 186 that are slidably mounted on a respective base 188, 190. Each base 188, 190 is mounted on a respective bearing slide 192, 194. The bearing slides 192, 194 are normally made from a low friction material, for example, a "TEFLON" material and extend over three sides of the bearing rail.

The longitudinal locations of each of the pusher arm assemblies 184, 186 are individually adjustable with respect to each other and the mounting plate 174. Referring to pusher arm assembly 186, locking handle 196 has a threaded shaft portion 198 that is threadedly engaged with one side of a bearing slide 194. Thus, by tightening the locking handle 196, the end of the threaded shaft 198 engages one side of the bearing rail, thereby locking the bearing slide 194 and respective base 190 and pusher arm assembly 186 at that location on the bearing rail 182. Loosening the locking handle 196 disengages the end of the threaded screw 198 from the bearing rail 182 and permits the bearing slide 194, base 190 and associated pusher arm assembly 186 to be moved to another location along the bearing rail 182. Tightening the handle 196 locks the pusher arm assembly 186 at that location on the bearing rail 182. The pusher arm assembly 184 and base 188 have identical structure to lock the base 188 at different locations along the rail 182.

Suspended from one end of each base 188, 190 is a respective cylinder 202, 204. The cylinders 202, 204 are normally fluid operated cylinders powered by pressurized air from a pneumatic source 57 via respective solenoid valves 203, 205 that may be for example, 4-way solenoid valves. The cylinders 202, 204 have respective cylinder rods 206, 208 on which the respective pusher arm assemblies 184, 186 are mounted. Thus, the cylinders 202, 204 can be operated to raise and lower the respective pusher arm assemblies 184, 186. When in the illustrated raised positions, the pushers 36, 40 on the respective pusher arms assemblies 184, 186 move above workpieces located on the end feed table 26 and within the plasma treatment chamber 22. When the cylinders 202, 204 lower the respective pusher arm assemblies 184, 186, the lower ends of the respective pushers 36, 40 are adjacent end edges of respective workpieces and are effective to push the workpieces as the transfer system 30 moves the pushers 36, 40 along the longitudinal axis of the drive screw 170.

Figure 11:
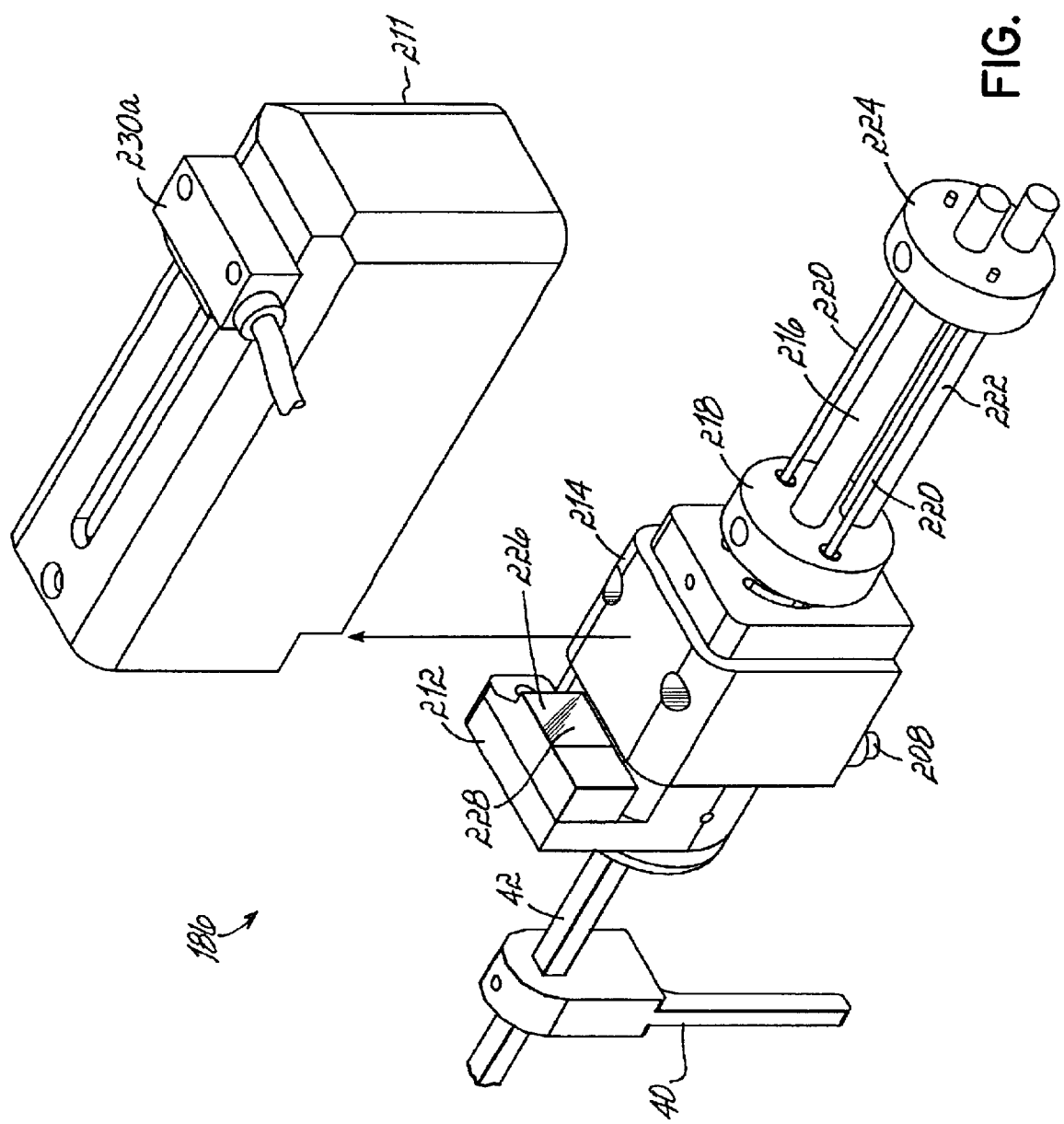
FIG. 11 is a disassembled perspective view of a jam detector used with each pusher bar assembly on the transfer system of FIG. 9.

Referring to FIG. 11, the pusher bar 42 is resiliently, rotationally mounted inside housing 211 of the load pusher arm assembly 186. Thus, in the event that the pushers 40 encounter a jammed workpiece 32b that cannot be moved, the pusher arm 42 pivots clockwise as the transfer system 30 moves the pusher 40 generally to the right as viewed in FIG. 9. The pivoting motion of the pusher arm 42 is detected and the motion of the pusher arm assembly 186 is immediately stopped. A flag 212 is attached to pusher arm 42 and rotates therewith. The pusher arm 42 and flag 212 are rotationally mounted with respect to a block 214. An inner disk 218 is rigidly connected to the block 214 and supports one end of a fixed shaft 222. An outer disk 224 is rigidly connected to shafts 220 and 222. Spring wires 220 have first ends connected to the outer disk 224. The spring wires 220 extend through clearance holes in the inner disk 218 and through slots in the block 214. Opposite ends of the spring wires 220 are connected to the pivotable flag 212.

During a workpiece chamber load operation, the pusher arm 42 and pushers 40 are moved linearly into contact with the trailing edges of the workpieces. If the pusher 40 encounters a jammed workpiece, as the transfer system 30 continues to linearly move the pusher arm 42, the pusher 40, pusher arm 42, flag 212 and spring wires 220 rotate clockwise. As the flag 212 pivots, the spring wires 220 flex or bend as they exit the rear side of inner disk 218 adjacent the block 214. The bending or flexing of the spring wires 220 creates a biasing torque tending to move the flag 212 in the opposite, counterclockwise, direction. The flag 212 has a reflective surface 226 adjacent a nonreflective area 228. The sensor 230a immediately detects a loss of the reflective surface 226 due to the clockwise rotation of the flag 212 and provides an output signal representing a workpiece jam condition. The output signal from the sensor 230a is effective to immediately stop the linear motion of the pusher arm 42 and pusher 40. When the jammed workpiece is cleared, the biasing torque provided by the spring wires 220 pivots the flag 212 and pusher arm 42 back to their original positions. The biasing torque is adjusted by moving the inner disk 218 on shaft 216. The resilient mounting of the pusher arm 38 is identical to the resilient mounting of pusher arm 42 shown as an example in FIG. 11, and a sensor 230b (FIG. 1) provides an output signal in the event that the pushers 36 encounter a jammed workpiece.

Figure 12:
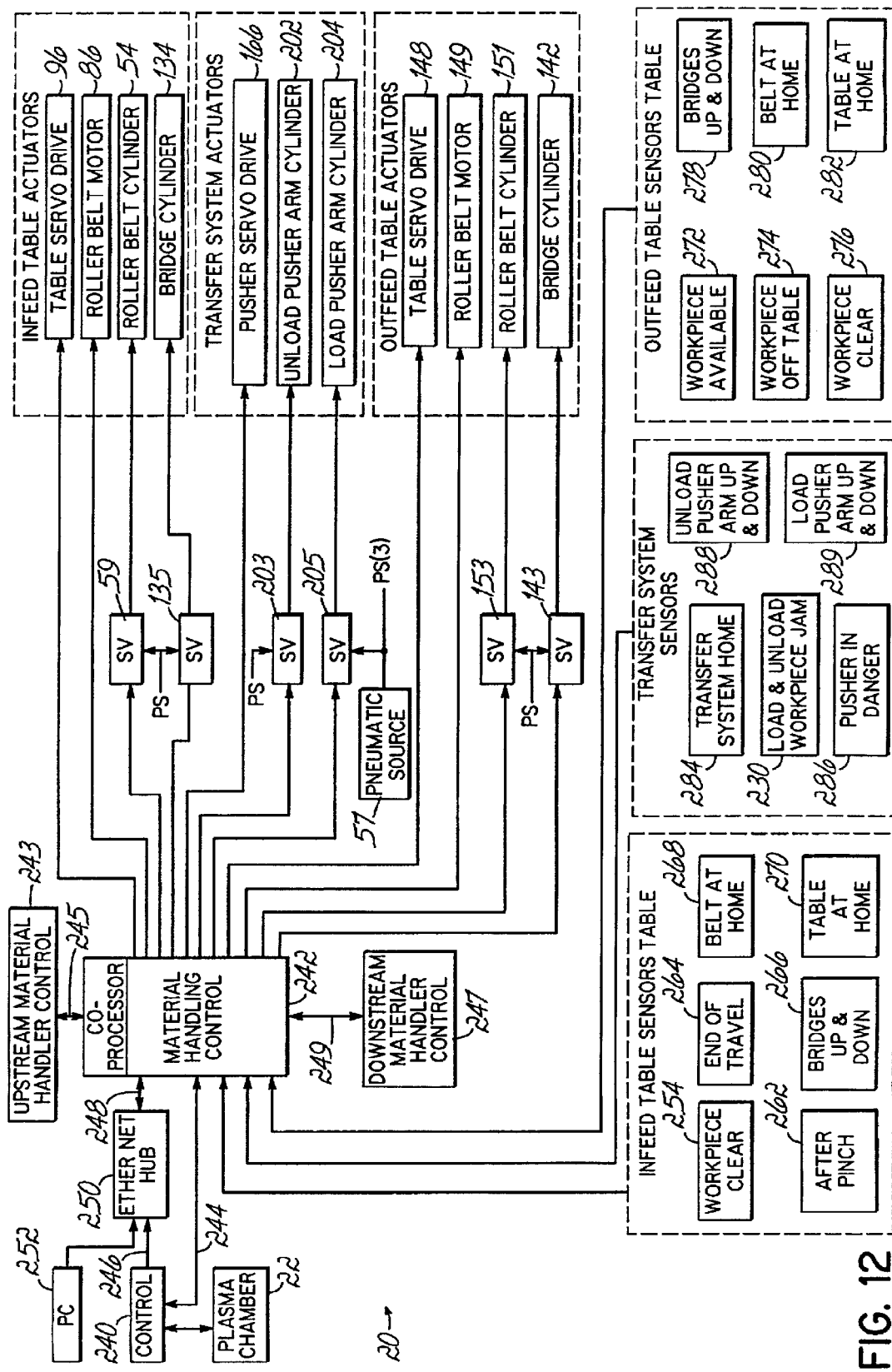
FIG. 12 is a schematic block diagram of a control system and actuators used in the plasma treatment system of FIG. 1.

Referring to FIG. 12, the plasma treatment system 20 of FIG. 1 includes the plasma treatment chamber 22 the operation of which is independently controlled by a controller 240. The material handling control 242 controls the operation of the infeed and outfeed tables 26, 28 and transfer system 30. The material handling control 242 has communication lines 244, for example, digital input/output ("I/O"), connected to the plasma chamber control 240. Similarly, the controls 240, 242 are also connected via respective communication lines 246, 248 to an Ethernet hub 250 that, in turn, is connected to a PC 252. The PC 252 operates as a user interface to the controls 240, 242. A graphical user interface is connected to the PC 252 in a known manner. The material handling control 242 is also electrically connected to an upstream material handler control 243 via a communication link 245, for example, digital I/O lines. The material handling control 242 is further electrically connected to a downstream material handler control 247 via a communication link 249, for example, digital I/O lines. The material handler control 242, control 240 and upstream and downstream controls 245, 247, respectively, are programmable logic controls that communicate using a known SMEMA communications protocol. Thus, the material handling control 242 can be readily connected to a wide variety of upstream and downstream material handling control systems.

The material handling control 242 provides command signals to operate the belt motor 86 and belt cylinder 54 in response to input signals received from various sensors associated with the infeed and outfeed tables 26, 28. For example, referring to FIG. 4, a workpiece-clear proximity sensor 254 is mounted on a sidewall 256 on the input side of the infeed table 26. Upon the upstream material handler 33 providing a workpiece to the infeed table 26, the leading edge of the workpiece is detected by the proximity sensor 254, thereby switching a workpiece-clear signal to a false state. A sensor bracket 258 is also slidably mounted on the support rails 68 and is normally positioned midway between the bearing housings 66a, 66b. Proximity sensors 262, 264 are mounted on the sensor bracket 258 and may be located anywhere along its length. The after-pinch sensor 262 is normally located after, or downstream of, the pinch wheel assembly 106. Upon the sensor 262 detecting the leading edge of the workpiece, an after-pinch signal is provided to the material handling control 242. The end-of-travel sensor 264 is located at the end of the bearing housings 66; and upon detecting the leading edge of a workpiece, the sensor 264 provides an end-of-travel signal to the material handling control 242. The infeed table further has up and down bridge sensors 266 (FIG. 12) that provide respectively bridge-up and bridge-down signals in response to the respective fully extended and fully retracted positions of the bridge cylinder rod 132. The cylinder 54 that lifts and lowers the belt drive assembly 52 has a belt-at-home sensor 268 indicating when the cylinder rod 56 is retracted, thereby moving the belt drive assembly to its home position. The servodrive 98 on the infeed table 26 also has a table-at-home sensor 270 indicating when the table 44 has been moved to its home position as illustrated in FIGS. 1 and 2.

The outfeed table 28 has sensors similar to the sensors on the infeed table 26. As shown in FIG. 12, the outfeed table 28 has a workpiece-available sensor 272 and a workpiece-off-table sensor 274 that are mounted on a sensor bracket similar to the sensor bracket 258 of the infeed table. A workpiece-clear sensor 276 is mounted on an external sidewall of the plasma treatment system 20 (FIG. 1) indicating when a workpiece has cleared the outfeed table 28. In its operation, the outfeed table 28 further has a bridge up and down sensors 278, a belt-at-home sensor 280 and a table-at-home sensor 282. The transfer system 30 has a transfer-system-home sensor 284 as shown in FIG. 9, a pusher-in-danger sensor 286 and the pusher-jam sensor 230.

In use, the operator of the plasma treatment system 20 must first perform a mechanical setup and then a program setup of the system. the first step of the mechanical setup is to determine which workpieces are to be processed. With the plasma treatment system 20, workpieces that range in size from about 16–160 millimeters ("mm") wide, about 40–300 mm long, and about 0.25–25 mm thick can be handled and processed. Thus, if a workpiece is 150 mm wide, only one workpiece can be handled and processed. However, if a workpiece is 25 mm wide, then 6 workpieces can be handled and processed simultaneously. Further, the plasma treatment system 20 has the ability to handle and process workpieces that weigh in the range of about 15–6000 grams. Therefore, the width of the part determines how many rails 48 are to be assembled on the infeed and outfeed tables 26, 28 as well as in the chamber 22. Referring to FIG. 2, setscrews 53 can be loosened so that support bars 49 can be slid out of the table 44. The desired number of rails 48 can then be slid onto and off of the support bars 49, and the support bars 49 are again locked into the sides 39 of the table 44 by using the locking setscrews 53. Sample workpieces can be placed between the rails 48 and the rail spacing adjusted, so that the workpieces can be easily moved. As the desired spacing of each rail is achieved, the setscrews 51 are tightened to lock the respective rail on the support bars 49.

After the rails have been adjusted, referring to FIG. 4, the bearing housing 66b and sensor bracket 258 are then adjusted. By loosening setscrews 67, the bearing housing 66b can be slid along support rails 68 and drive shaft 84. As shown in FIG. 6, the bearing housing 66b should be located such that its belt 76 is located immediately below rollers 50. When properly positioned, the setscrews 67 are then tightened to secure the bearing housing 66b in its proper location. The sensor bracket 256 also has setscrews (not shown) that secure the bracket 258 at its desired location on the support rails 68. As shown in FIG. 6, the sensor rail 258 is positioned to be substantially equidistant from the bearing housings 66a, 66b. Thereafter, the number of pushers 36, 40 on the respective pusher bars 38, 42 is adjusted to match the number workpieces being processed with each cycle. The pushers 36, 40 are secured on the respective pusher bars 38, 42 by set screws that when loosened, permit the pushers 36, 40 to be slid on or off the respective pusher bars 38, 42. Thus, a required number of pushers 36, 40 can be mounted and properly aligned on the respective pusher bars 38, 42.

After the location of the sensor bracket 258 has been adjusted, it may then be desirable to adjust the location of the sensors 262, 264 on the bracket 258. The after-pinch sensor 262 can be adjusted by visually observing the location of the sensor 262 with respect to a respective pinch wheel 112. Alternatively, a workpiece can be manually moved with respect to the sensor 262 to find the desired sensor location. Similarly, the end-of-travel sensor 264 can be adjusted either visually or by moving a workpiece between the rails. The workpiece is pushed toward the discharge end 34 until the end-of-travel sensor 264 detects its presence. At that point, the forward end of the workpieces should be substantially adjacent the upright bridges 126 which act as positive stops. The location of the end-of-travel sensor 264 on the sensor bracket 258 can be adjusted as necessary. However, normally, once the location of the sensors 262, 264 is set, they are not changed.

Figure 13:
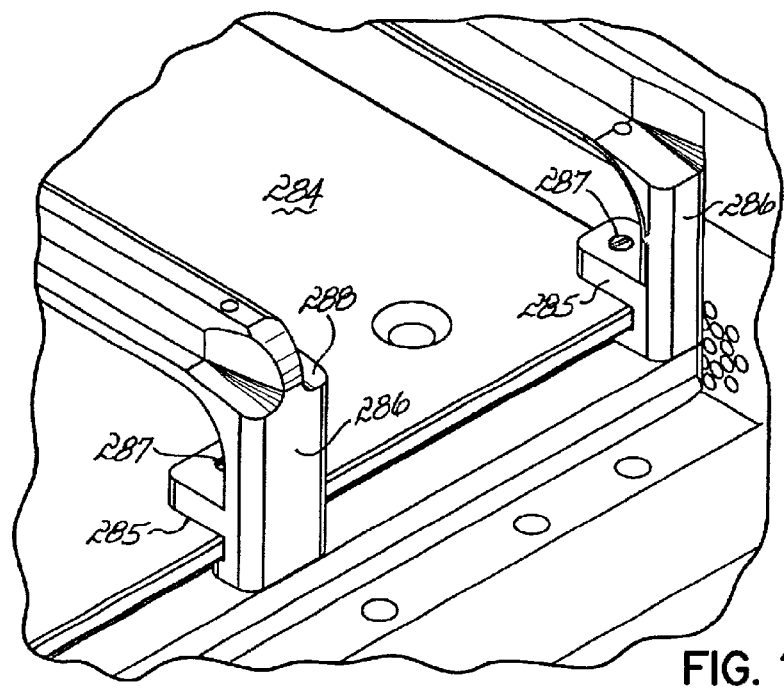
FIG. 13 is a partial perspective view of an electrode and workpiece transfer rails used with the plasma treatment chamber of the plasma treatment system of FIG. 1.
Figure 14:
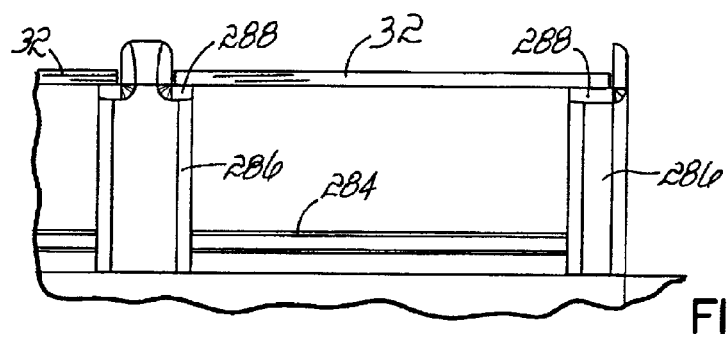
FIG. 14 is an end view of the electrode and rails with the plasma treatment chamber of FIG. 13.

Referring to FIG. 1, in a similar manner, the outfeed table 28 is mechanically setup to have a number of rails 150 matching the number of rails 48 on the infeed table 26. Similarly, a bearing housing and sensor bracket (not shown) on support rails 145 of a belt drive assembly 147 are adjusted to match the setup of the rails 150. Further, the plasma treatment chamber 22 must contain rails that match the number and spacing of rails on the infeed and outfeed tables 26, 28. Referring to FIGS. 1, 13 and 14, the chamber 22 has an electrode 284 to which the rails 286 are clamped. The rails 284 have a C-clamp portion 285 that slidingly captures an end of the electrode 284. Setscrews or other fasteners 287 secure the rails 286 in their desired location on the electrode and in alignment with the rails 48, 150 on the respective infeed and outfeed tables 26, 28. The rails 286 also have respective generally horizontal linear surfaces 288 that support workpieces 32 as they are pushed across the surfaces 288 by the pushers 36, 40.

At this point, the mechanical setup of the transfer system 30 is performed. The locking handle 196 on the load pusher bar mechanism 186 is loosened and the pusher bar assembly 186 slid on the bearing rail 182 until it is located a desired distance behind the trailing end of the workpieces. While it is not absolutely necessary to so locate the load pusher arm assembly 186, it does reduce the travel time of the transfer system 30 and provide a more efficient material handling cycle. Normally, with the pusher servodrive 166 at its home position, the adjustment of the unload pusher arm assembly is not required. At this time, if necessary, a flag 290 may also be adjusted with respect to the transfer-system-home sensor 284 so that the pusher servodrive 166 (FIG. 10) locates the carriage 100 at its desired home position when the home position is commanded.

After the mechanical setup is completed, the program setup is performed. During the program setup, a graphical user interface (not shown) associated with the PC 252 is used by an operator to provide input commands to operate the infeed and outfeed tables 26, 28 and the transfer system 30. As will be appreciated, the user interface has the capability of providing commands to manually operate all of the actuators in the plasma treatment system 20. First, the desired positions or endpoints for indexing the tables 44 and 144 on the respective infeed and outfeed tables 26, 28 must be determined. When the servodrive 96 on the infeed table 26 is at its home position, the upstream material handler 33 (FIG. 1) is aligned with the support blocks 43 and drive rollers 50 between an outer rail 48a and a first inner rail 48b. The operator uses the graphical interface to provide input commands to operate the servodrive 96 to move the table 44 to an endpoint or position that aligns the upstream material handler with a successive pair of rails, that is, the two inner rails 48b. The operator then provides an input command to record and store that endpoint as a taught point in the material handler control 242. In a similar manner, the operator uses the user interface to command the servodrive 96 to move the table 44 to successive positions at which the table 44 is aligned with the upstream material handler; and those taught points are recorded and stored in the control 242. As will be appreciated, the number of taught points for the table 44 determines the number of workpieces to be loaded onto the infeed table 26, that is, one plus the number of taught points. In a similar manner, the operator manually operates the servodrive 148 on the outfeed table 28 to teach desired positions of the table 144, so that the outfeed table can automatically align the table 144 with the downstream material handler.

Next, with respect to the transfer of workpieces into and out of the chamber 22, the material handling control 242 must be taught two positions or points in order to properly automatically operate the transfer system 30. The first point relates to the end point or location of the preprocessed workpieces 32 pushed into the chamber 22 from the infeed table 26. It is desired that the workpieces be about centrally located within the chamber 22. Therefore, using the PC 252, the operator provides input commands to lower the load pusher arm 42 and command the pusher servodrive 166 to move preprocessed workpieces from the infeed table 26 into the chamber 22. By means of user-generated commands, the pusher servodrive 166 is commanded to push workpieces to a desired load point or position within the chamber 22. When that desired load position is found, the operator provides a command to record and store that load point in the material handling control 42 for use during the automatic infeed cycle.

Similarly, due to the variation in length of the workpieces, the transfer of the postprocessed workpieces from the plasma treatment chamber 22 to the outfeed table 28 by the unload pusher arm 38 must also be determined and taught or programmed. Again, the operator manually commands the pusher servodrive 166 to move workpieces with the unload pusher arm 38 from the plasma treatment chamber 22 to a desired unload endpoint or position on the outfeed table 28. When that desired unload position has been achieved, the operator then provides a command to record and store that unload position in the material handling control 242. As will be appreciated, the material handling control 242 can be programmed with a setup cycle to lead the user through all of the steps of the mechanical and program setup. After the setup is complete, the plasma treatment system 20 can then be placed in service.

Figure 15:
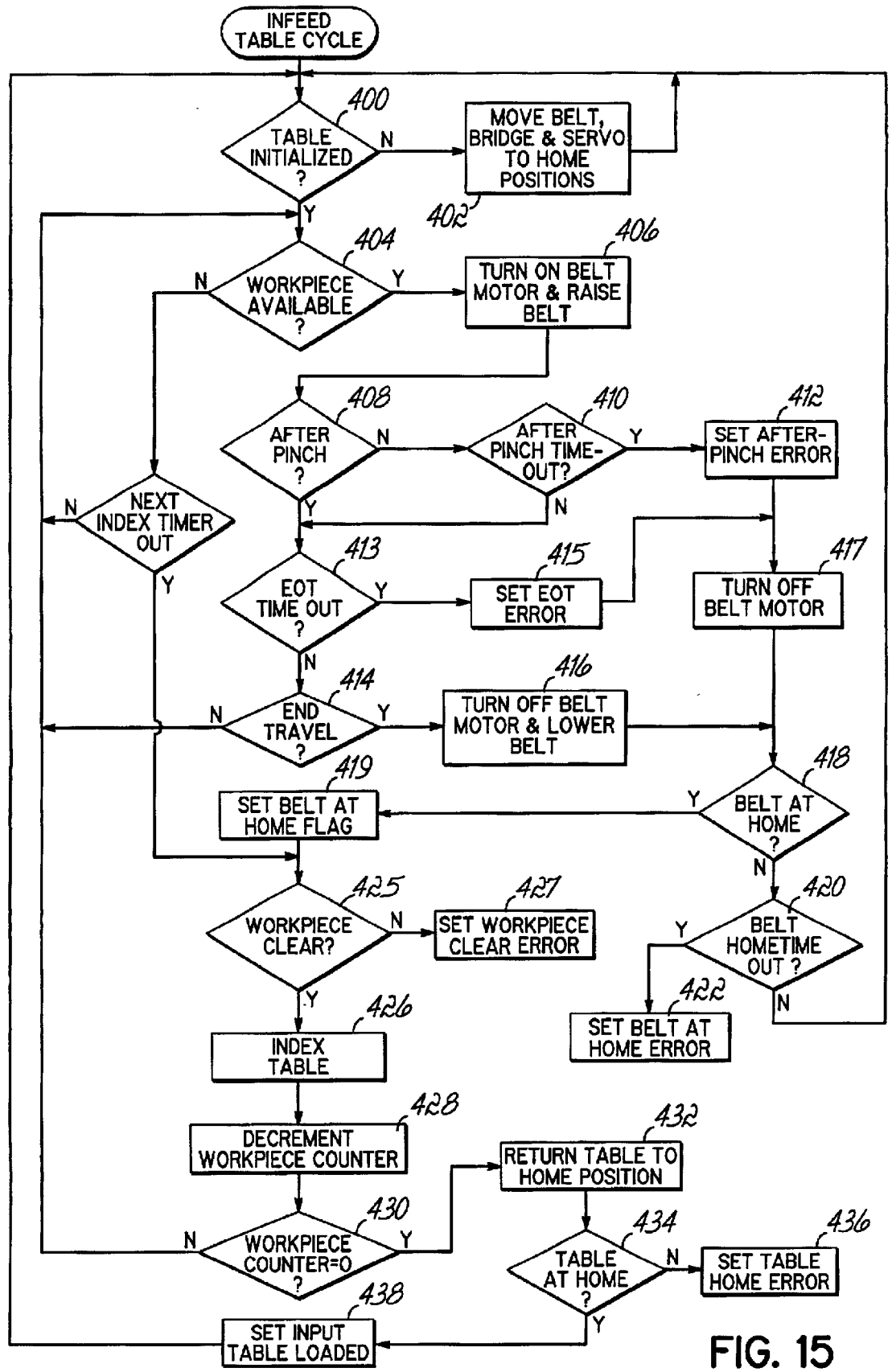
FIG. 15 is a flowchart representing a cycle of operation of the infeed table of FIG. 2.

The first process to be executed by the material handling control 242 is the execution of an infeed table cycle as illustrated in FIG. 15 in which workpieces are transferred one at a time from an upstream material handler 33 to the infeed table 26. Before an infeed table cycle can begin, the control 242 determines, at 400, whether the infeed table 26 is initialized. Initialization by definition requires three states. First, the table servodrive must be at its home position, that is, a position in which the rails 48 on the infeed table 26 are aligned with the rails 286 of the plasma treatment chamber 22. Further, the belt cylinder 54 must be at home, that is, in its lowered position. Finally, the bridges 126 must be in their home or raised position. If any of those conditions are not met, the material handling control 242 provides commands, at 402, to the appropriate actuators to achieve an initialized state.

Upon achieving initialization, the material handling control 242 sets a machine-ready signal true and then, at 404, looks for a workpiece-available signal on communication link 245 from the upstream material handler control 243. Whenever the upstream material handler 33 has a workpiece available for transfer, the upstream material handler control 243 switches a workpiece-available signal to a true state. Upon the material handler control 242 detecting true states for both the machine-ready and workpiece-available signals, provides a signal state over communication link instructing the upstream material handler to begin a workpiece transfer. In addition, the control 242, at 406, turns on the roller belt motor 86 and switches the state of the solenoid valve 59 causing the cylinder 54 to raise the belt drive assembly 92. Thus, the belts 76 are powering drive rollers 50 on a pair of rails, for example, rails 48a and 48b. In addition, the control 242 starts internal after-pinch and an end-of-travel timers. The upstream material handler 33 pushes a workpiece between pincher rollers 112 and drive rollers 50, and the powered drive rollers 50 begin to transfer the workpiece 32b across the infeed table 26.

The material handling control 242 then, at 408, looks for the occurrence of an after-pinch signal from the sensor 262 (FIG. 4). The after-pinch sensor 262 is simply confirming that a workpiece is properly moving across the table 26. Thus, if the material handling control 242 does not detect an output signal from the after-pinch sensor 262, it determines, at 410, whether the after-pinch timer has expired. The after-pinch timer represents a period of time within which the after-pinch sensor 262 should detect the presence of a workpiece 32b. If, at 410, the control 242 determines that the after-pinch timer has expired, there may be a workpiece jam or other problem. Therefore, the material handling control 242 proceeds, at 412, to set an after-pinch error and then, at 416, to turn off the roller belt motor 86 and command the cylinder 54 to its home position, thereby lowering the belt drive assembly 52 and the roller belts 76 out of contact with the rollers 50. The material handling control 242 also sets an internal belt home timer representing a time period within which the belt drive assembly should achieve its home position.

The control 242 then, at 418, determines whether the belt drive assembly 52 has its home or lower position. If the belt-home position is detected at 418, the control 242 sets a belt-home flag or state. If not, the control 242 checks the state, at 420, of a belt-home timer. If the belt-home timer expires prior to the belt-home sensor 268 on the cylinder 54 detecting a belt-home position, the control 242 then, at 422, sets a belt-home error. If the belt-home timer has not expired, the process being executed by the control 242 loops back and iterates again.

If the workpiece 32b is proceeding normally across the table, the sensor 262 provides an after-pinch signal to the material handling control 242, which is detected at 408. The control 242 then looks for the expiration of the EOT timer at 413. If the EOT timer has not expired, the control 242 then, at 414, looks for an end-of-travel signal from the sensor 264. When an end-of-travel signal is received, the control 242, at 416, turns off the roller motor 86 and commands the cylinder 54 to its home position to lower the roller belt 76. The control 242 then iterates through process steps 418–422 to determine if the belt drive assembly 52 properly returns to its home position. If the workpiece is not proceeding normally across the infeed table 26, an end-of-travel signal will not be provided by the sensor 264; and the control 242 will detect, at 413, an expiration of the EOT timer. Thereafter, an EOT error is set at 415, and, at 417–422, the belt motor is turned off; and the control 242 determines whether the belt reaches its home position.

If a workpiece has been properly loaded onto the table 44, then the table 44 can be indexed with the servodrive 96 to align another pair of rails 48 with the upstream material handler 33. Prior to indexing the table 44, the control 242, at 425, determines whether the sensor 254 is detecting a presence of a workpiece. If so, that means that a workpiece is partially on and partially off the infeed table 26; and therefore, indexing the table 44 may damage that workpiece. Upon the control 242 detecting a false state of the workpiece-clear signal from the sensor 254, it proceeds, at 427, to set a workpiece clear error.

If the workpiece-clear signal is true, at 426, the material handling control 242 provides command signals to the table servodrive 96 to index the table to the next workpiece location. The control 242 moves the table 44 to the first taught position to align another pair of rails, for example, rails 48b, 48b (FIG. 2), on the table 44 with the upstream material handler. Thereafter, at 428, the control 242 decrements the workpiece counter which had been set to be equal to the total number of workpieces to be loaded onto the infeed table 26. The control 242 then, at 430, determines whether a workpiece counter is zero. If it is not, the process described with respect to process steps 404–452 is repeated until the control 242 determines that all the workpieces 32b have been loaded by detecting a zero value of the workpiece counter at 430. Thereafter, the control 242 provides command signals, at 432, to the table servodrive 96 causing the table servodrive 96 to return the table 44 to its home position. The home position is detected by a table-at-home sensor 270 located within the servodrive 96. In a manner similar to that described with respect to the belt-at-home check at 418, the control 242 starts a belt-at-home timer upon commanding the table to return to its home position at 432. If an output from the sensor 270 is not detected within the timed period of the belt-at-home timer, the material handling control 242 sets a table-home error at 436. If, at 434, the control 242 detects a table-at-home signal from the sensor 270, it then proceeds, at 438, to set an input-table-loaded flag.

It should be noted that after indexing the table 44 to its next position, the control 242 sets a next-index internal timer and returns to await a subsequent work-piece available signal from the upstream material handler 243. If no workpiece-available signal is detected at 404 and the control 242, at 440, detects the expiration of the next-index timer, the table will be indexed to its home position. Thus, even though the table 44 may be setup for some number of workpieces, for example, five, any fewer number of workpieces will be treated. Such a situation often occurs at the end of a batch of workpieces being treated.

Figure 16A:
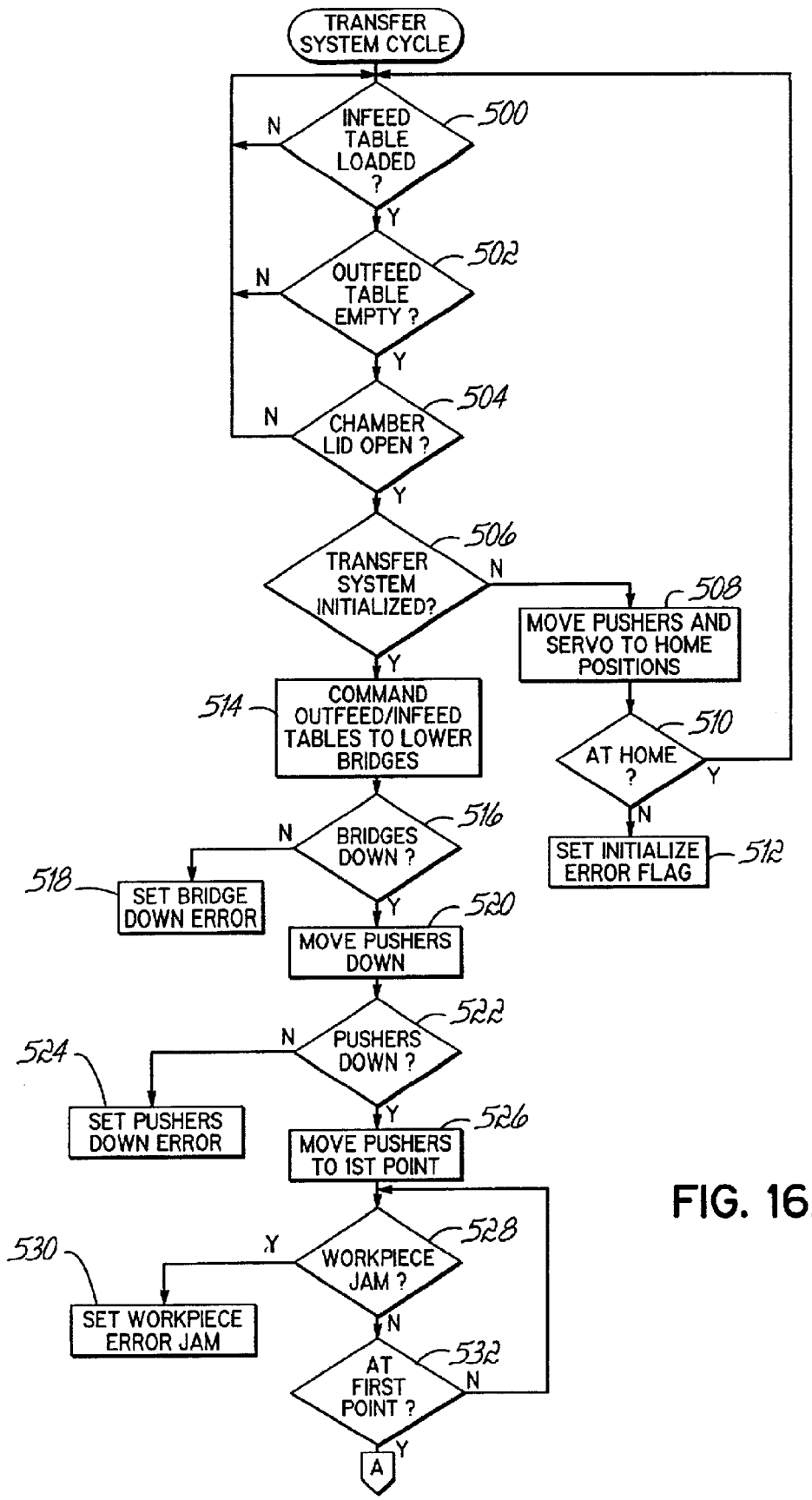
FIGS. 16A and 16B are flowcharts representing a cycle of operation of the transfer system of FIG. 9.
Figure 16B:
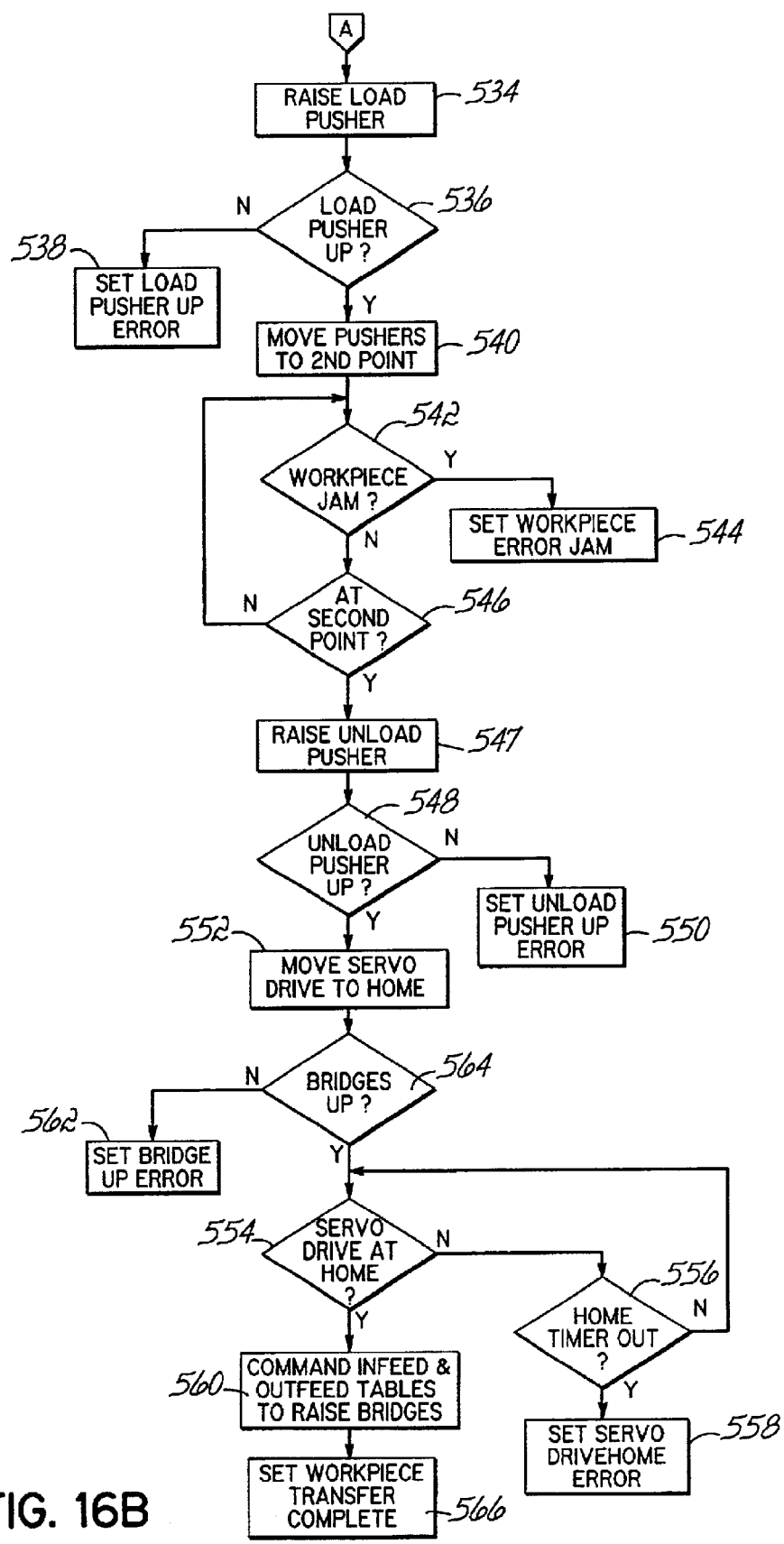

With the input table 26 loaded, the material handling control 242 is now ready to operate the transfer system 30 to transfer workpieces 32b into the plasma treatment chamber 22. The transfer process is illustrated in FIGS. 16A–16B. Before initiating a transfer cycle, the material handling control 242 first determines that the infeed table is full at 500; that the outfeed table 28 is empty at 502; that the chamber lid 35 is open at 504; and that the transfer system 30 is initialized at 506. The control 240 (FIG. 12) operating the plasma treatment chamber 22 is responsible for opening the chamber lid 35 and provides a chamber-clear signal over the communications link 244 to the material handling control 242. Initialization of the transfer system requires that the respective unload and load pushers 36, 40 be in their raised home position and that the pusher servodrive 166 be at its home position. Thus, the material handling control 242 looks for an output signal from the sensor 284 detecting the home position of the pusher servodrive 166 and output signals from the sensors 288, 299 on the respective cylinders 202, 204 indicating that the pusher arms are up. If any of those sensor signals are missing, the material handling control 242 then, at 508, provides command signals to the appropriate actuators to move those actuators toward their respective home positions. If, at 510, the respective home positions cannot be detected within a timed period after detecting, at 506, that the transfer system is not initialized, the material handling control 242 then, at 512, sets an initialization error flag.

After, at 506, determining that the transfer system 30 is properly initialized, the control 242, at 514, switches the states of the solenoid valves 135, 143 causing the respective cylinders 134, 142 on the respective infeed and outfeed tables 26, 28 to lower the bridges 126, 140, respectively. The control 242 then, at 516, determines whether output signals have been received from sensors 266, 278 associated with the respective cylinders 134, 142 indicating that the bridges 126, 140 have been lowered. If not, a bridge-down error is set at 518.

After the bridges have been successfully lowered, the controller 242 then, at 520, switches the states of the solenoid valves 203, 205 causing the respective cylinders 202, 204 to lower their respective unload and load pusher arms 38, 42. The control 242 then, at 522, looks for output signals from sensors associated with the cylinders 202, 204 indicating that the pusher arms 38, 42 are in their lowered position. If those output signals are not detected within a timed period after the control 242 provides a command to the cylinders 202, 204 to lower the pusher arms 38, 42, the control 242 sets a pusher-down error at 524.

Upon the pusher arms 38, 42 being properly lowered, the material handling control 242 provides commands, at 526, to the pusher servodrive 166 to move the pushers 36, 40 from left to right as generally viewed in FIG. 1, the unload pushers 40 first contact the trailing edges of preprocessed workpieces 32b (FIG. 1) loaded on the infeed table 26 and push those preprocessed workpieces from the infeed table 26 into the chamber 22. Simultaneously, the unload pushers 36 are contacting trailing edges of respective postprocessed workpieces 32c within the chamber 22 and pushing those postprocessed workpieces from the chamber 22 to the outfeed table 28. As the pusher servodrive 166 moves the pusher arms 38, 42, the material handling control 242 continuously checks, at 528, the state of the jam sensor 230. If an output signal is detected, the control 242, at 530, sets a workpiece-jam error at 530.

In the absence of a workpiece jam, the control 242 continues to check whether the servodrive 166 has moved the load pusher arm 42 to the taught load point. When the taught load point is reached, the workpieces 32c are at the desired location within the plasma treatment chamber 22. Thereafter, at 532, the control 242 then, at 534, switches the state of the solenoid 205, thereby causing the cylinder 204 to raise the load pusher arm 42. At 536, the control 242 determines whether the load pusher arm 42 is in the up position. If the control fails to detect the raised load pusher arm 42, a load-pusher-up error is set at 538. The material handling control 242 then proceeds, at 540, to command the pusher servodrive 166 to move the unload pusher arm 38 to the taught unload point. Again, at 542 and 544, the control 242 detects a workpiece jam by monitoring the jam sensor 230. The control 242 continues, at 546, to detect when the pusher servodrive 166 moves the unload pusher arm 38 to the taught, unload point. When the unload point is reached, the workpieces 32d are now loaded on the outfeed table 28. Normally, the workpieces 32d are pushed onto the outfeed table so that their entire length is fully supported by the rollers 154.

When the unload point is detected, the control 242, at 548, switches the state of the solenoid valve 203 causing the cylinder 202 to raise the unload pusher arm 38. If the unload pusher arm 38 fails to rise properly, the control 242 then, at 550, provides a set-unload-pusher-up error. When the unload pusher arm 38 is detected to be in its raised position, at 548, the control 242 then commands, at 552, the pusher servodrive 166 to move the transfer system 30 to its home position, that is, back to its starting position as viewed in FIGS. 1 and 9. Simultaneously, the control 242, at 560, switches the states of the solenoid valves 135, 143 causing the respective cylinders 134, 142 on the respective infeed and outfeed tables 26, 28 to raise their respective bridges 126, 140. If the bridge-up sensors 266, 278 on the respective tables 26, 28 fail to provide an output signal within a timed period, a bridge-up error is set at 562. When the control 242, at 564, detects that the bridges 126, 140 are in their raised position, at 554, the control 242 detects the state of the transfer-system-home sensor 284 and if, at 556, the sensor 284 fails to provide an at-home signal within a timed period, a pusher-home error is set at 558. When, at 554, the control 242 detects that the servodrive 166 is at its home position, the control 242 sets a workpiece-transfer-complete flag at 566.

At this point, preprocessed workpieces 32b (FIG. 1) that were stored in parallel on the infeed table 26 have been moved in unison to a center position within the plasma treatment chamber 22. Simultaneously, postprocessed workpieces 32c that were treated in the plasma treatment chamber 22, have been pushed to a location on the outfeed table 28. Thus, the infeed table 26 is empty and ready to receive additional workpieces 32a from an upstream workpiece handler 33; and the output table 28 is full and ready to serially discharge workpieces 32d to a downstream workpiece handler.

Figure 17:
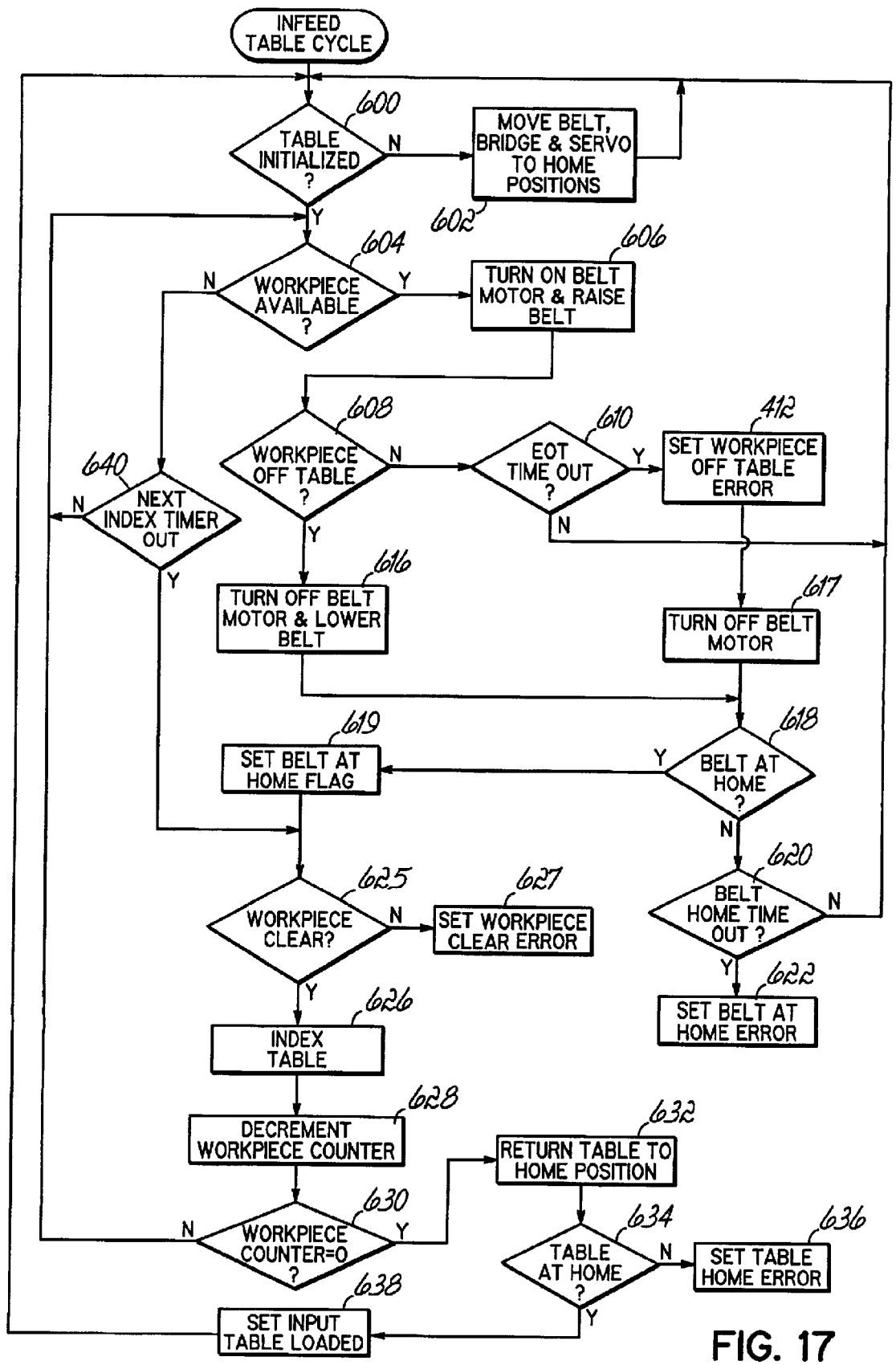
FIG. 17 is a flowchart representing a cycle of operation of an outfeed table of FIG. 1.

Upon detecting that the workpiece transfer is complete, the outfeed table cycle of FIG. 17 is executed is executed by the material handling control 242 of FIG. 10. The cycle is similar to the infeed table cycle described in FIG. 15. For example, first, at 600, the control 242 determines that the table is initialized; and if the table is not initialized, the control 242, at 602, provides the necessary commands to move the outfeed table to its initialized position. Upon the outfeed table 28 achieving initialization and having workpieces loaded thereon as determined by the proximity sensor 272, a workpiece available signal is set by the control 242 and provided to the downstream material handler control 247 via communication link 249. Whenever the downstream material handler 33 is ready to accept a workpiece from the outfeed table 28, the downstream material handler control 247 switches a machine-ready signal to a true state. Upon the material handler control 242 detecting true states of the workpiece available and machine-ready signals, at 604, it then at 606, turns on the roller belt motor 294 and activates cylinders (not shown) on the belt drive assembly 147 of the outfeed table 28. In addition, the control 242 starts an internal end-of-travel timer. The belts are raised into contact with the drive rollers 154, thereby powering the drive rollers 154 to move a workpiece 32d across the outfeed table 28. In addition, at 606, the control 242 starts an internal end-of-travel ("EOT") timer.

The state of a workpiece-off-table sensor 274 is detected, at 608. The sensor 274 is located near the downstream end of the outfeed table 28. Its exact location will vary depending on the type of downstream material handler being used. If a workpiece-off-table signal is not detected, the control 242 then, at 610, detects the state of the EOT timer; and if the timer has expired, the control 242 set an EOT error is set at 612. In addition, at 617–622, the control 242 commands the roller belt motor 294 to turn off. Absent any errors, the workpiece 32d continues to travel across the outfeed table 28 and into the control of the downstream material handler 247. In that process, the workpiece-off-table sensor 274 changes state that is detected at 608. When off the table 144, the workpiece is out of the control of the rollers 154, and at 616–622, the belt motor 294 is turned off and the belt drive assembly is lowered.

At this point, the table 144 is ready to be indexed to align the next workpiece with the downstream material handler 247. A workpiece-clear sensor 276 detects whether a workpiece 32d is partially on and partially off the table 144. If a workpiece is hungup on the end of the table 144, the table should not be moved. The control 242, at 625, detects the state of the sensor 276; and if a workpiece is detected, a workpiece-clear error is set at 627. If the absence of a workpiece-clear error, at 626, the material handling control 242 commands the table servodrive 148 to index the table 144 such that the next workpiece 32d is aligned with the downstream material handler. The above process continues until all of the workpieces 32d queued on the table 144 have been serially transferred from the outfeed table 28 to the downstream material handler 37. When the last workpiece transfer is detected at 630, the control 242 then proceeds, at 632–638, to return the outfeed table 144 to its home position and set an outfeed-table-unloaded flag.

In a manner similar to the operation of the infeed table 26, if no workpiece-available signal is detected at 604 and the control 242, at 640, detects the expiration of the next-index timer, the table will be indexed to its next location. Thus, even though the table 144 may be setup for some number of workpieces, for example, five, any fewer number of workpieces will be unloaded to the downstream material handler 37.

While the invention has been illustrated by the description of one embodiment and while the embodiment has been described in considerable detail, there is no intention to neither restrict nor in any way limit the scope of the appended claims to such detail. Additional advantages and modifications will readily appear to those who are skilled in the art. For example, in the described example, the driven rollers 50 are driven by a vertically movable belt 76 extending over drive rollers 78. As will be appreciated, in alternative embodiments, the number of drive and driven rollers may vary. Further, the rollers 78 may be eliminated and the belt 76 extended over the rollers 50. In that embodiment, the vertical motion of the belt 76 would be eliminated. In a further embodiment, the drive rollers 78 could be driven by gears or another device and the belt 76 eliminated. In this embodiment the drive rollers 78 could contact and drive the driven rollers 50. In another variation, the driven rollers 50 could be driven by gears or another device and the drive rollers 78 and belt 76 eliminated. Further, a set of rollers 78 along one edge of a workpiece can be eliminated, so that a workpiece is driven on only the opposite edge. One or more horizontal surfaces can be used to support the workpiece along its one edge. In still further alternative embodiments, the rails 48 may be fixed and nonadjustable, thereby fixing the widths of workpieces that can be transferred.

Further, in the described embodiment, the depiction of the processes in FIGS. 15–17 is an overview of the operation of the plasma treatment system 20 and is presented in a manner to facilitate a flowchart presentation. Flowcharts by their nature represent a sequential presentation that is convenient for purposes of understanding. As will be appreciated, steps in the processes described in FIGS. 15–17 may be performed in a different order or may executed simultaneously. Further, any embodiment of the processes will necessarily differ depending on the individual performing the actual reduction to practice, the specifications for the system and the capability of the control components available. For example, the use of sensors and internal timers to test for the movement of actuators and workpieces may or may not be used. Or, such motion may be detected in other ways.

Therefore, the invention in its broadest aspects is not limited to the specific details shown and described. Consequently, departures may be made from the details described herein without departing from the spirit and scope of the claims, which follow.

What is claimed is:

1. A method of moving workpieces to and from a plasma treatment chamber comprising:
   providing infeed and outfeed tables adjacent a plasma treatment chamber;
   receiving automatically first workpieces serially, one at a time, onto the infeed table by
      receiving one of the first workpieces onto the infeed table,
      moving the one of the first workpieces in a first direction toward a discharge end of the infeed table,
      moving the infeed table to a position aligning a portion of the infeed table with a workpiece receiving location, receiving another of the first workpieces onto the infeed table, and moving the other of the first workpieces in the first direction;

storing the first workpieces is parallel on the infeed table;

transferring automatically and in parallel the first workpieces from the infeed table into the plasma treatment chamber;

receiving automatically second workpieces serially, one at time, onto the infeed table during plasma treating of the first workpieces;

storing the second workpieces in parallel on the infeed table; and after plasma treating the first workpieces, transferring simultaneously and in parallel
the first workpieces from the plasma treatment chamber onto the outfeed table, and
the second workpieces from the infeed table into the plasma treatment chamber.

2. The method of claim 1 further comprising moving the infeed table in a second direction substantially perpendicular to the first direction to a position aligning a portion of the infeed table with the workpiece receiving location.

3. The method of claim 1 further comprising stopping motion of the one of the first workpieces prior to moving the infeed table.

4. The method of claim 1 further comprising iterating the step of receiving another of the first workpieces onto the infeed table and moving the other of the first workpieces in the first direction until all of the first workpieces are loaded on the infeed table.

5. The method of claim 1 wherein the step of receiving automatically second workpieces further comprises:
receiving one of the second workpieces onto the infeed table;
moving the one of the second workpieces in a first direction toward a discharge end of the infeed table;
moving the infeed table to a position aligning a portion of the infeed table with a workpiece receiving location;
receiving another of the second workpieces onto the infeed table; and moving the other of the second workpieces in the first direction.

6. The method of claim 5 further comprising moving the infeed table in a second direction substantially perpendicular to the first direction to a position aligning a portion of the infeed table with the workpiece receiving location.

7. The method of claim 6 further comprising stopping motion of the one of the second workpieces prior to moving the infeed table.

8. The method of claim 5 further comprising iterating the step of receiving another of the second workpieces onto the infeed table and moving the other of the second workpieces in the first direction until all of the second workpieces are loaded on the infeed table.

9. The method of claim 1 wherein after transferring the first workpieces on the outfeed table, the method further comprises:
moving one of the first workpieces in a first direction towards a discharge end of the outfeed table;
transferring the one of the first workpieces from the outfeed table;
moving the outfeed table to a position aligning another of the first workpieces with a workpiece discharge position;
moving the other of the second workpieces toward the discharge end of the outfeed table; and transferring the other of the second workpieces from the outfeed table.

10. The method of claim 9 further comprising moving the outfeed table in a second direction substantially perpendicular to the first direction to a position aligning the other of the first workpieces with the workpiece discharge position.

11. The method of claim 9 further comprising stopping motion of the one of the first workpieces prior to moving the outfeed table.

12. The method of claim 9 further comprising iterating the step of receiving another of the first workpieces onto the outfeed table and moving the other of the first workpieces in the first direction until all of the first workpieces are loaded on the outfeed table.

13. The method of claim 1 further comprising:
lowering first pusher elements to a location immediately adjacent ends of respective second workpieces on the infeed table;
lowering second pusher elements to a location immediately adjacent ends of respective first workpieces in the plasma treatment chamber;
moving the second pusher element in the first direction towards the outfeed table to move the first workpieces from the plasma treatment chamber onto the outfeed table; and
moving the first pusher element in the first direction towards a discharge end of the infeed table to move the second workpieces from the infeed table into the plasma treatment chamber.

14. The method of claim 13 further comprising moving the first and second pusher elements simultaneously in the first direction.

15. The method of claim 13 further comprising moving the first and second pusher elements simultaneously in the first direction and into contact with ends of the respective second and first workpieces and thereafter, continuing to simultaneously move the first and second pusher elements to move the first workpieces from the plasma treatment chamber to the outfeed table and the second workpieces from the infeed table into the plasma treatment chamber.

16. The method of claim 13 further comprising lowering bridge elements between the infeed and outfeed tables and the plasma treatment chamber before continuing to move the first and second pusher arms.

17. The method of claim 14 further comprising:
stopping motion of the first and second pusher elements in response to the second workpieces being moved into the plasma treatment chamber;
raising the first pusher element to a location above the second workpieces; and
continuing to move the first and second pusher elements and the first workpieces in the first direction to continue to move the first workpieces on the outfeed table.

18. The method of claim 17 further comprising stopping motion of the first and second pusher elements in response to the second workpieces being moved to about a center of the plasma treatment chamber.

19. The method of claim 18 further comprising:
stopping motion of first and second pusher elements in response to the first workpieces being moved onto the outfeed table;

raising the second pusher element to a location above the second workpieces; and moving the first and second pusher elements to a location not interfering with an operation of the plasma treatment chamber.

20. The method of claim 19 further comprising moving the first and second pusher elements in a second direction opposite the first direction to a location not interfering with an operation of the plasma treatment chamber.

21. The method of claim 17 further comprising raising the bridge elements between the infeed and outfeed tables and the plasma treatment chamber after continuing to move the first and second pusher elements.

* * * * *